(12) United States Patent
Takada

(10) Patent No.: US 7,280,129 B2
(45) Date of Patent: Oct. 9, 2007

(54) PIXEL POSITION SPECIFYING METHOD, METHOD OF CORRECTING IMAGE OFFSET, AND IMAGE FORMING DEVICE

(75) Inventor: Norihisa Takada, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 300 days.

(21) Appl. No.: 10/863,357

(22) Filed: Jun. 9, 2004

(65) Prior Publication Data

US 2004/0252180 A1    Dec. 16, 2004

(30) Foreign Application Priority Data

Jun. 10, 2003   (JP) ............... 2003-164704
Jun. 10, 2003   (JP) ............... 2003-164705

(51) Int. Cl.
    *B41J 2/435*    (2006.01)
(52) U.S. Cl. ..................... 347/235; 347/250
(58) Field of Classification Search ............... 347/229, 347/233–238, 242, 246–250; 355/43
    See application file for complete search history.

(56) References Cited

U.S. PATENT DOCUMENTS

| | | | |
|---|---|---|---|
| 4,814,829 A * | 3/1989 | Kosugi et al. | ............... 355/43 |
| 5,581,075 A | 12/1996 | Naraki et al. | |
| 5,717,451 A * | 2/1998 | Katano et al. | ............... 347/242 |
| 5,825,400 A | 10/1998 | Florence et al. | |
| 6,201,559 B1 * | 3/2001 | Wada et al. | ............... 347/236 |

FOREIGN PATENT DOCUMENTS

JP     09216411 A   *  8/1997
JP     10-031170 A     2/1998

OTHER PUBLICATIONS

Larry J. Hornbeck "Digital Light Processing and MEMS: Refleting the Digital Display Needs of the Networked Society" The International Society for Optical Engineering, Proceedings of SPIE, vol. 2783, Aug. 1996, pp. 2-11.
W.E. Nelson and Robit L. Bhuva "Digital Micromirror Device Imaging Bar for Hard Copy", The International Society for Optical Engineering, Proceedings of SPIE, vol. 2314, Apr. 1995, pp. 58-65.
European Search Report dated Nov. 10, 2006 issued in EP Application No. 04013462.9.

* cited by examiner

*Primary Examiner*—Hai Pham
(74) *Attorney, Agent, or Firm*—Sughrue Mion, PLLC

(57) ABSTRACT

A pixel position specifying method in an image forming device, the method measuring positions of exposure beams of the respective exposure heads and specifying pixel positions of junctures of the exposure heads, the method includes: using a beam position detecting mechanism to measure the positions of the exposure beams; detecting a first exposure beam position on an image receiving surface provided at the beam position detecting mechanism, by turning on a first connecting pixel near a juncture of a first exposure head; detecting a second exposure beam position on the image receiving surface, by turning on a second connecting pixel near a juncture of a second exposure head and moving the beam position detecting mechanism in the Y axis direction; and specifying connecting pixel positions from a moving amount of the beam position detecting mechanism in the Y axis direction and positions of exposure beams of the exposure heads.

37 Claims, 27 Drawing Sheets

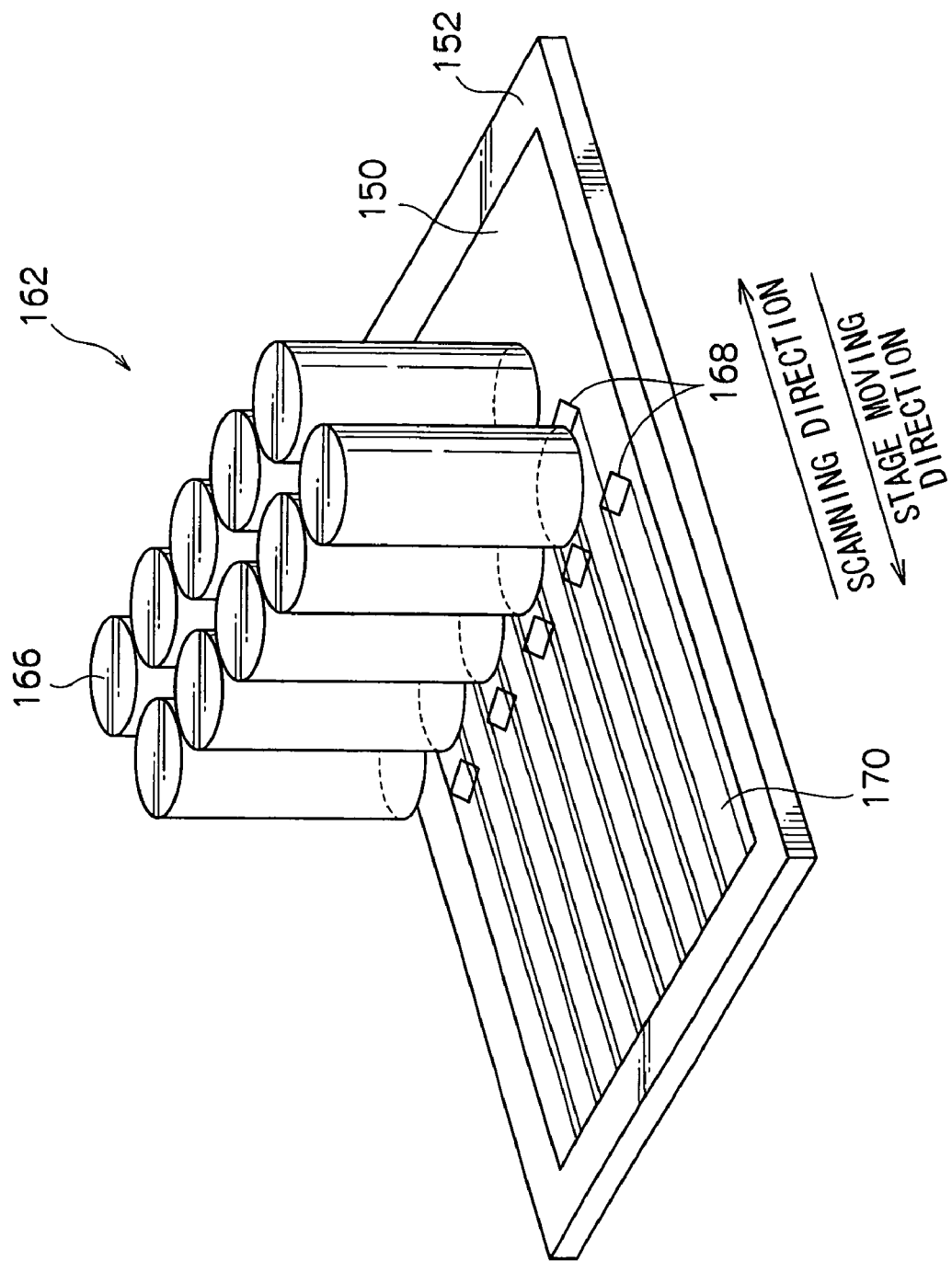

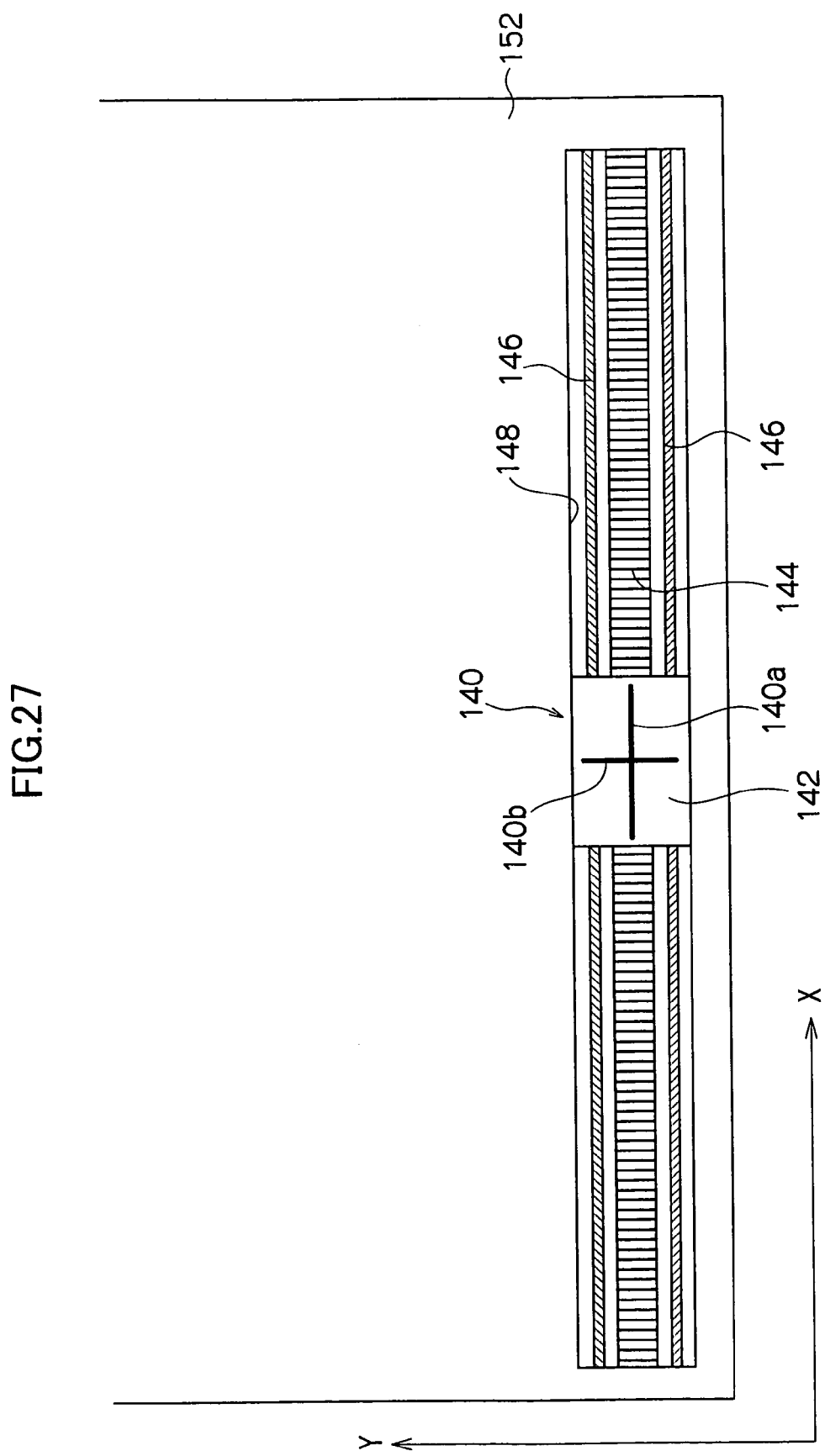

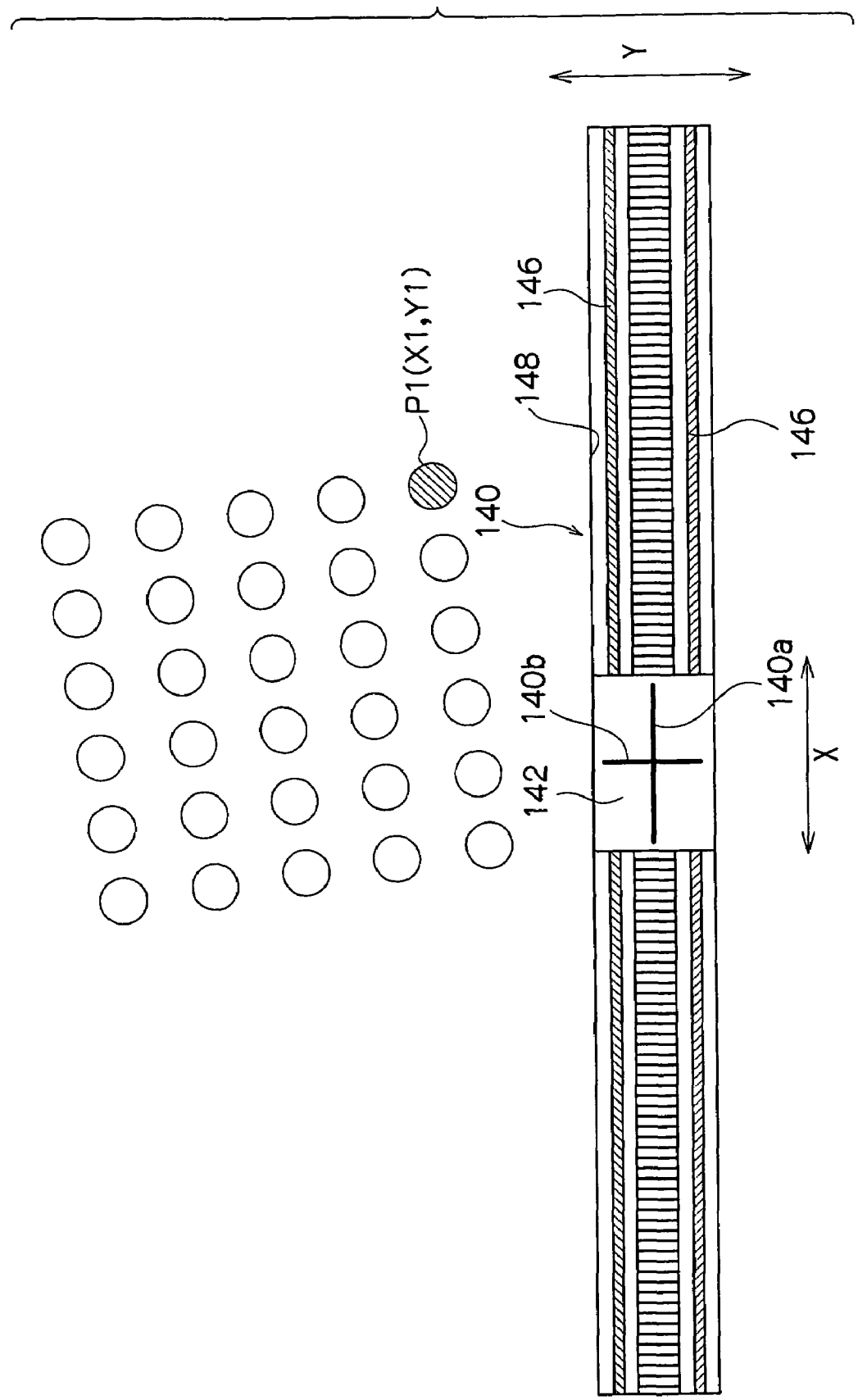

PIXEL POSITION SPECIFYING METHOD, METHOD OF CORRECTING IMAGE OFFSET, AND IMAGE FORMING DEVICE

CROSS-REFERENCE TO RELATED APPLICATION

This application claims priority under 35 USC 119 from Japanese Patent Applications Nos. 2003-164704 and 2003-164705, the disclosures of which are incorporated by reference herein.

BACKGROUND OF THE INVENTION

1. Field of the Invention

The present invention relates to a pixel position specifying method, a method of correcting image offset, and an image forming device. In particular, the present invention relates to, in an image forming device equipped with a plurality of exposure heads, a pixel position specifying method which can specify with high accuracy the positions of connecting pixels at exposure heads even if relative positions among exposure heads change, and a method of correcting image offset which can form an image of high quality in which junctures ("seams") are not conspicuous, and an image forming device which can correct offset between images of exposure heads in accordance with the method of correcting image offset.

2. Description of the Related Art

Conventionally, various exposure devices, which carry out image exposure by a light beam modulated in accordance with image data by using spatial light modulators (SLMs) such as digital micromirror devices (DMDs) or the like, have been proposed as examples of image recording devices. (See, for example, Larry J. Hornbeck, "Digital Light Processing and MEMS: Reflecting the Digital Display Needs of the Networked Society", THE INTERNATIONAL SOCIETY FOR OPTICAL ENGINEERING, Proceedings of SPIE, Volume: 2783, 8/1996, pp. 2-11, and W. E. Nelson and Robit L. Bhuva, "Digital Micromirror Device Imaging Bar for Hard Copy", THE INTERNATIONAL SOCIETY FOR OPTICAL ENGINEERING, Proceedings of SPIE, Volume: 2413, 4/1995, pp. 58-65.) A DMD is structured, for example, by providing a large number of extremely small micromirrors on respective memory cells such as SRAMs, and varies the angles of the reflecting surfaces of the micromirrors by static electricity due to charges accumulated in the respective memory cells. When carrying out image drawing in actuality, in a state in which image data is written to the respective SRAMs, the respective micromirrors are reset and set to predetermined angles, and the directions of reflection of the light are made to be desired directions.

One example of a field of application of exposure devices is the manufacturing of panels of, for example, liquid crystal displays and the like.

A multi-head exposure device is an example of an exposure device for the manufacturing of panels. In the multi-head exposure device, a plurality of exposure heads having DMDs are arranged along a direction perpendicular to the direction of feeding a photosensitive material such as a substrate or the like, in order to widen the range of exposure.

In the multi-head exposure device, the relative positions among the respective heads are adjusted with high accuracy to the extent that junctures do not cause problems in actual practice.

However, in recent years, as the degree of integration of substrates has increased, even higher resolutions have come to be demanded. Therefore, the allowable value of the offset between the relative positions of the images corresponding to the respective exposure heads has decreased.

Moreover, in an exposure head, a large number of optical members and mechanism members and the like are used from the light source to the imaging surface. Therefore, due to thermal expansion and thermal contraction of the respective members due to changes in temperature, and due to the accumulation of changes over time due to usage over a long period of time, offset or overlapping to an extent which cannot be ignored arises at the portions of the images which are junctures of the respective exposure heads, and a problem arises in that the image quality deteriorates.

A method has been proposed in which, in a multibeam exposure device used for purposes similar to those of the above-described multi-head exposure device, the positions of respective beams are detected by position detecting elements such as position sensing devices (PSDs) or quartered detectors or the like, and the offset between the images formed by the respective beams is corrected (see, for example, Japanese Patent Application (JP-A) No. 10-31170).

However, the intervals between the exposure heads in a multi-head exposure device are much larger than the intervals between adjacent beams. Therefore, it is difficult to apply the aforementioned method to a multi-head exposure device.

SUMMARY OF THE INVENTION

The present invention was developed in order to overcome the above-described problems, and an object of the present invention is to provide, in an image forming device such as the above-described multi-head exposure device or the like, a pixel position specifying method which can, from the positions of exposure beams of exposure heads, specify the positions of pixels corresponding to the exposure beams, and a method of correcting image offset and an image forming device which can make offset and overlapping of images at the juncture portions of respective exposure heads be extremely small.

A first aspect of the present invention provides a pixel position specifying method in an image forming device which forms an image by scanning, in a given direction, a plurality of exposure heads which can selectively turn a plurality of pixels on and off, the method measuring positions of exposure beams of the respective exposure heads and specifying pixel positions of junctures of the exposure heads, the method comprising: using a beam position detecting mechanism, which can move on a reference surface along a Y axis direction which is parallel to the scanning direction, to measure the positions of the exposure beams; detecting a first exposure beam position in an xy coordinate on an image receiving surface provided at the beam position detecting mechanism, by turning on a first connecting pixel in a vicinity of a juncture of a first exposure head; detecting a second exposure beam position in an xy coordinate on the image receiving surface, by turning on a second connecting pixel in a vicinity of a juncture of a second exposure head and moving the beam position detecting mechanism in the Y axis direction; and specifying connecting pixel positions, which specify positions of the first connecting pixel and the second connecting pixel on the reference surface, from a moving amount of the beam position detecting mechanism in the Y axis direction and positions, on the image receiving surface, of exposure beams of the first exposure head and the second exposure head.

The x axis and the y axis at the light receiving surface of the beam position detecting mechanism are parallel to the X axis and the Y axis of the reference surface, respectively.

The exposure beams illuminated from the exposure heads are parallel to one another, and are perpendicular to the reference surface. Therefore, at the exposure heads, the exposure beam positions detected in the first exposure beam position detecting step and the second exposure beam position detecting step correspond to the positions of the first connecting pixel and the second connecting pixel, respectively.

In this pixel position specifying method, in the step for detecting the first exposure beam position, the exposure beam of the first exposure head is detected, and in the step for detecting the second exposure beam position, the beam position detecting mechanism is moved along the Y axis direction and detects the exposure beam of the second exposure head.

Accordingly, the difference between the positions of the exposure beams in the X axis direction in the first exposure beam position detecting step and the second exposure beam position detecting step, corresponds to the difference between the relative positions of the first connecting pixel and the second connecting pixel in the X axis direction.

The difference between the relative positions of the first connecting pixel and the second connecting pixel in the Y axis direction, is the sum of the difference of the Y axis direction positions of the exposure beams in the step for detecting the first exposure beam position and the step for detecting the second exposure beam position, and the amount of movement of the beam detecting mechanism in the step for detecting the second exposure beam position.

Accordingly, the difference in the relative positions of the first connecting pixel and the second connecting pixel can be specified merely by measuring the illuminated positions of the exposure beams of the first exposure head and the second exposure head.

Here, in order to correct the offset or overlapping between the first exposure head and the second exposure head, it is sufficient to know the difference in the relative positions of the first connecting pixel and the second connecting pixel.

Therefore, if the difference between the relative positions of the first connecting pixel and the second connecting pixel is specified by the pixel position specifying method relating to the first aspect, and the image data inputted to the first exposure head and the second exposure head is corrected on the basis of the specified difference in the relative positions, even in cases in which the first exposure head and the second exposure head are offset from their initial positions, it is possible to prevent the occurrence of offset and overlapping of images at the juncture portions of the exposure heads due to this offset.

A second aspect of the present invention provides a pixel position specifying method in an image forming device which forms an image by scanning, in a given direction, a plurality of exposure heads which are formed so as to be able to selectively turn a plurality of pixels on and off and which are disposed diagonally with respect to a scanning direction, the method measuring positions of exposure beams of the respective exposure heads and specifying pixel positions of junctures of the exposure heads, the method comprising: using a beam position detecting mechanism, which can move on a reference surface along a Y axis direction which is parallel to the scanning direction, to measure the positions of the exposure beams; specifying, as a first connecting pixel, a pixel which corresponds to an exposure beam incident on a position closest to x=0 on an xy coordinate of an image receiving surface of the beam position detecting mechanism which is movable on the reference surface along the Y axis direction which is parallel to the scanning direction, by successively turning on pixels positioned in a vicinity of a juncture of a first exposure head; detecting a first beam position which is a position on the reference surface of the beam position detecting mechanism at a time when a connecting pixel specified as the first connecting pixel is turned on and the beam position detecting mechanism moves along the Y axis direction and an exposure beam of the first exposure head is illuminated onto an origin of the xy coordinate on the image receiving surface; specifying, as a second connecting pixel, a pixel which corresponds to an exposure beam incident on a position closest to x=0 on the xy coordinate of the image receiving surface of the beam position detecting mechanism, by successively turning on pixels positioned in a vicinity of a juncture of a second exposure head; detecting a second beam position which is a position on the reference surface of the beam position detecting mechanism at a time when a connecting pixel specified as the second connecting pixel is turned on and the beam position detecting mechanism moves along the Y axis direction and an exposure beam of the second exposure head is illuminated onto the origin of the xy coordinate on the image receiving surface; and specifying positions of the first connecting pixel and the second connecting pixel on the reference surface, on the basis of the first beam position and the second beam position.

In accordance with the pixel position specifying method relating to the second aspect, after the first beam position is detected in the step for detecting the first beam position, the beam position detecting mechanism is moved in the Y axis direction and detects the second beam position. Accordingly, the first beam position and the second beam position are on the same X coordinate. Here, the first beam position and the second beam position are illuminated positions of the exposure beams corresponding to the first connecting pixel and the second connecting pixel, respectively. Therefore, the specified first connecting pixel and second connecting pixel are also on the same X coordinate. As described above, the first connecting pixel and the second connecting pixel exist at juncture portions of the first exposure head and the second exposure head, respectively. Thus, by connecting the images at the specified first connecting pixel and second connecting pixel, an image which does not have a break along the X axis direction can be formed. Further, an image in which there is no offset or overlapping along the Y axis direction can be formed by adjusting the exposure timings between the respective exposure heads on the basis of the scanning direction of the exposure heads and the distance between the first beam position and the second beam position, i.e., the Y axis direction distance between the first connecting pixel and the second connecting pixel.

A third aspect of the present invention provides a pixel position specifying method in an image forming device which forms an image by scanning, in a given direction, a plurality of exposure heads which can selectively turn a plurality of pixels on and off, the method measuring positions of exposure beams of the respective exposure heads and specifying pixel positions of junctures of the exposure heads, the method comprising: using a beam position detecting mechanism, which can move on a reference surface along a Y axis direction which is parallel to the scanning direction and along an X axis direction which is perpendicular to the Y axis direction, to measure the exposure beams; detecting a first beam position (X1, Y1) which is a position of the beam position detecting mechanism on the reference surface at a time when a first connecting pixel in a vicinity of a juncture of a first exposure head is turned on and the beam position detecting mechanism is moved along the X axis and the Y axis directions and an exposure beam is illuminated onto an origin (x=0, y=0) at a light receiving surface of the beam position detecting mechanism; detecting a second beam position (X2, Y2) which is a position of the beam position detecting mechanism on the reference surface at a time when a second connecting pixel in a vicinity of a juncture of a second exposure head is turned on and the beam position detecting mechanism is moved along the X axis and the Y axis directions and an exposure beam is illuminated onto the origin at the light receiving surface of the beam position detecting mechanism; and specifying positions of the first connecting pixel and the second connecting pixel on the reference surface, on the basis of the first beam position and the second beam position.

The exposure beams illuminated from the exposure heads are parallel to one another, and are perpendicular to the reference surface. Thus, the first beam position and the second beam position are positions, on the reference surface, of the first connecting pixel and the second connecting pixel respectively.

In the above-described pixel position specifying method, the beam position detecting mechanism, which can move along the X axis and Y axis directions, is used to detect the first connecting pixel and the second connecting pixel. The position of the beam position detecting mechanism on the XY coordinate at the time when the exposure beam from the first connecting pixel is illuminated onto the origin of the beam position detecting mechanism, is set as the first beam position. The position of the beam position detecting mechanism on the XY coordinate at the time when the exposure beam from the second connecting pixel is illuminated onto the origin of the beam position detecting mechanism, is set as the second beam position.

Because the range over which the beam position detecting mechanism can specify the positions of the exposure beams does not have to be that wide, a compact detecting element can be used.

The beam position detecting mechanism may comprise any of a two-dimensional PSD, a quartered photodetector, a two-dimensional CCD, and a two-dimensional CMOS.

All of the two-dimensional PSD, quartered photodetector, two-dimensional CCD, and two-dimensional CMOS can specify, in two dimensions, the position of a spot light such as a pixel which is turned on and off by the exposure head. Accordingly, a single element suffices in order to specify, in two dimensions, the positions of the first and second connecting pixels at the beam position detecting mechanism.

Further, the exposure heads may selectively turn the plurality of pixels on and off by spatial light modulators which modulate light from a light source in accordance with inputted image data.

In an exposure head of a type which selectively turns a plurality of pixels on and off by a spatial light modulator which modulates light from a light source in accordance with inputted image data, the positions of the connecting pixels can be specified with high accuracy. Therefore, even if the exposure heads shift from their initial positions for some reason, the occurrence of offset and overlapping between the exposure heads can be prevented.

Further, the present invention is a method of correcting image offset in an image forming device which forms an image by scanning, in a given direction, a plurality of exposure heads which can selectively turn a plurality of pixels on and off, the method correcting offset and overlapping between images of the respective exposure heads, the method comprising: specifying positions, on the reference surface, of a first connecting pixel in a vicinity of a juncture of a first exposure head and a second connecting pixel in a vicinity of a juncture of a second exposure head, by the pixel position specifying method of claim 1; and on the basis of the positions of the first connecting pixel and the second connecting pixel whose pixel positions have been specified, correcting image data inputted to the first exposure head and the second exposure head so that images are connected at the first connecting pixel and the second connecting pixel.

In the above-described method for correcting image offset, in the step of specifying the pixel positions, the difference in the relative positions of the first connecting pixel and the second connecting pixel is specified merely by measuring the exposure beam illuminating positions of the first exposure head and the second exposure head.

Then, in the step of correcting the image data, on the basis of the difference in the relative positions of the first connecting pixel and the second connecting pixel specified in the pixel position specifying step, the image data inputted to the first exposure head and the second exposure head is corrected so that the images overlap at the first connecting pixel and the second connecting pixel.

Accordingly, even if the first exposure head and the second exposure head are offset from their initial positions for some reason, the occurrence of offset and overlapping of the images at the juncture portions of the exposure heads due to such offset can be prevented.

Moreover, in the present invention, in image data correction in which pixel positions, on the reference surface, of the first connecting pixel in a vicinity of the juncture of the first exposure head and the second connecting pixel in a vicinity of the juncture of the second exposure head are specified by the pixel position specifying method of the first aspect and, on the basis of the positions of the first connecting pixel and the second connecting pixel whose pixel positions have been specified, image data inputted to the first exposure head and the second exposure head is corrected so that images are connected at the first connecting pixel and the second connecting pixel: Y axis direction offset between the first connecting pixel and the second connecting pixel is eliminated by setting exposure timings of the first exposure head and the second exposure head in accordance with a Y axis direction distance between the first connecting pixel and the second connecting pixel and a scanning speed of the exposure heads, and X axis direction offset between the first connecting pixel and the second connecting pixel is eliminated by inputting image data to the first exposure head and the second exposure head so that image data overlap at the first connecting pixel and the second connecting pixel.

The second pixel is detected by moving, in the Y axis direction, the beam position detecting mechanism which detected the first connecting pixel. Therefore, although the positions of the first connecting pixel and the second connecting pixel on the Y coordinate are different, their positions on the X coordinate are substantially the same.

Accordingly, image data is inputted to the first exposure head and the second exposure head such that the image data overlaps at the first connecting pixel and the second pixel. At the same time, if the exposure timings of the first exposure head and the second exposure head are set so that Y axis direction offset does not arise, offset and overlapping of the images of the first connecting pixel and the second pixel can be eliminated.

Further, even for three or more exposure heads, positions, on the reference surface, of connecting pixels at respective image heads are specified by the pixel position specifying, and the image data inputted to the respective exposure heads is corrected on the basis of the positions of the connecting pixels specified by the pixel position specifying, so that images are connected at the connecting pixels.

Also in an image forming device having a large number of exposure heads, an image of good quality in which there is no offset or overlapping between the exposure heads is formed by correcting the offset or overlapping between images of one exposure head and another exposure head whose image is connected to the one exposure head.

A fourth aspect of the present invention is an image forming device comprising: an exposure mechanism having a plurality of exposure heads which can selectively turn a plurality of pixels on and off, the exposure mechanism forming an image by exposing while scanning an image forming surface in a given direction by the exposure heads; a pixel position specifying mechanism specifying positions of pixels of the exposure heads by measuring positions of exposure beams of the respective exposure heads provided at the exposure mechanism by a beam position detecting mechanism which is movable on a reference surface along a Y axis direction, which is parallel to the scanning direction, in order to measure positions of the exposure beams; and an exposure control mechanism controlling the exposure heads on the basis of results of detection of the pixel positions at the beam position detecting mechanism, wherein, by the pixel position specifying method of the first aspect, the beam position detecting mechanism specifies positions, on the reference surface, of a first connecting pixel in a vicinity of a juncture of a first exposure head and a second connecting pixel in a vicinity of a juncture of a second exposure head, and on the basis of the positions of the first connecting pixel and the second connecting pixel specified at the pixel position specifying mechanism, the exposure control mechanism corrects image data inputted to the first exposure head and the second exposure head, so that images are connected at the first connecting pixel and the second connecting pixel.

In the above-described image forming device, the relative positional relationship of the first connecting pixel and the second connecting pixel is specified by the pixel position specifying method relating to the present invention. On the basis of this relative positional relationship, the image data inputted to the first exposure head and to the second exposure head is corrected, and the images are connected at the first connecting pixel and the second connecting pixel.

Accordingly, even in a case in which the positions of the exposure heads are offset for some reason, offset or overlapping between the images of the exposure heads is automatically corrected. Therefore, such offset or overlapping of the images does not arise.

In the fourth aspect, the pixel position specifying mechanism may have, as the beam position detecting mechanism, a pixel position detecting element selected from a two-dimensional PSD, a quartered photodetector, a two-dimensional CCD, and a two-dimensional CMOS.

All of the two-dimensional PSD, quartered photodetector, two-dimensional CCD, and two-dimensional CMOS can specify, in two dimensions, the position of a spot light such as a pixel which is turned on and off by the exposure head. Accordingly, a single element suffices in order to specify, in two dimensions, the positions of the first and second connecting pixels at the beam position detecting mechanism.

Further, all of these pixel position detecting elements are highly sensitive. Therefore, it is possible to carry out operations such as making the light amounts of the exposure heads small when the relative positional relationship between the first connecting pixel and the second connecting pixel is specified and offset or overlapping between images of the exposure heads is corrected, and making the light amounts of the exposure heads large when forming an image.

Further, the exposure heads have spatial light modulators which modulate light from a light source in accordance with inputted image data, and the plurality of pixels are selectively turned on and off by the spatial light modulators.

Moreover, the spatial light modulators have a plurality of pixels which are arranged diagonally with respect to the scanning direction.

In accordance with the above-described image forming devices, it is easy to form an image such that gaps are not formed between the exposure heads. Further, the pixel position specifying methods relating to the present invention can be particularly suitably applied to these image forming devices.

In addition, the pixels of the spatial light modulators are arranged in two dimensions.

The image forming device, which carries out exposure by using a plurality of exposure heads at which are provided spatial light modulators at which pixels are arranged in two dimensions, can be widely applied to the manufacture of liquid crystal displays or the like. In the above-described image forming device, image offset between the exposure heads is corrected by the method of correcting image offset of the present invention. Therefore, even in a case in which an image having a large surface area is formed by a large number of exposure heads, offset or overlapping between the exposure heads does not arise.

A fifth aspect of the present invention provides a pixel position specifying method in an image forming device which forms an image by scanning, in a given direction, a plurality of exposure heads which can selectively turn a plurality of pixels on and off, the method measuring positions of exposure beams of the respective exposure heads and specifying pixel positions of junctures of the exposure heads, the method comprising: measuring a position of an exposure beam by using a beam position detecting mechanism which is formed so as to be movable on a reference surface along a Y axis direction which is parallel to a scanning direction of the exposure device, and which has at least one pair of slit portions, which are disposed so as to be inclined relative to arrangements of pixels of the exposure heads and which intersect one another, and a light amount measuring mechanism, which measures light amounts of exposure beams which pass through the slit portions; specifying a position of a first connecting pixel on the basis of a position of the beam position detecting mechanism and positions of the slit portions and an angle formed by the slit portions, at a time when the first connecting pixel in a vicinity of a juncture of an image at a first exposure head is turned on and the beam position detecting mechanism is moved along the Y axis direction and light amounts of exposure beams passing through one slit portion and another slit portion reach peaks; and specifying a position of a second connecting pixel on the basis of a position of the beam position detecting mechanism and the angle formed by the slit portions, at a time when the second connecting pixel in a vicinity of a juncture of an image at a second exposure head is turned on and the beam position detecting mechanism is moved along the Y axis direction and light amounts of exposure beams passing through the one slit portion and the other slit portion reach peaks.

In the above-described pixel position specifying method, the beam position detecting mechanism, at which is formed at least one pair of slit portions which are inclined relative to the pixel arrangements at the exposure heads and which are disposed so as to intersect one another, is moved in the Y axis direction, and detects the first connecting pixel and the second connecting pixel.

For example, when the beam position detecting mechanism passes under the first connecting pixel, the light amount of the exposure beam passing through one slit portion of the pair of slit portions reaches a peak. Thereafter, the light amount of the exposure beam passing through the other slit portion of the pair of slit portions reaches a peak.

Accordingly, the position of the first connecting pixel can be specified on the basis of the position of the beam position detecting mechanism at the time when the transmitted light amount of the exposure beam at one slit portion reaches a peak, and the position of the beam position detecting mechanism at the time when the transmitted light amount of the exposure beam at the other slit portion reaches a peak, and the angle formed by the one and the other slit portions. The same holds for the second connecting pixel as well. Here, the position of a specific point which is on the beam position detecting mechanism can be used as the position of the beam position detecting mechanism. However, usually, the position of the point of intersection of the slit portions is used as the reference.

Usually, the exposure beam is illuminated from the exposure head perpendicularly onto the reference surface. Therefore, when a given pixel of the exposure head is lit, the illuminated position of the exposure beam on the reference surface is the same as the position of that pixel. Accordingly, in the step of specifying the first pixel position and the step of specifying the second pixel position, the position of the exposure beam detected at the beam position detecting mechanism can be made to be the position of the first or the second connecting pixel.

The actual positions of the first connecting pixel and the second connecting pixel can be specified with high accuracy in this way. Accordingly, even if positional offset arises between the first exposure head and the second exposure head for some reason, offset or overlapping between the images of the exposure heads can be eliminated by controlling the exposure timings of the exposure heads on the basis of the specified positions of the first connecting pixel and the second connecting pixel.

Further, because it suffices for the light amount measuring mechanism to be able to measure the light amount of the exposure beam passing through the slit portion, a usual light receiving element is sufficient. Accordingly, there is no need to use an expensive position detecting element, such as a two-dimensional PSD or a quartered detector or the like, in order to detect the position of the exposure beam. Therefore, the beam position detecting mechanism can be structured inexpensively.

Moreover, the multi-head exposure device discussed in the "Description of the Related Art" usually has an exposure stage on which the substrate to be exposed is placed and which moves in a given direction. The position of the exposure stage in the feeding direction, i.e., the Y axis direction, is detected with high accuracy by a linear encoder or the like.

Accordingly, if the beam position detecting mechanism is fixed to the non-exposure surface of the exposure stage and the position is detected by the linear encoder while the exposure stage is moved in the feeding direction, the position of the beam position detecting mechanism can also be detected with high accuracy. In this way, the actual positions of the first connecting pixel and the second connecting pixel can also be specified with high accuracy.

The specifying of the positions of the first connecting pixel and the second connecting pixel can be carried out with high accuracy by using a conventional multi-head exposure device almost as is.

Moreover, the beam position detecting mechanism is moved along the Y axis direction, i.e., the scanning direction, and the first connecting pixel and the second connecting pixel are selected, and the positions thereof are specified. In this way, a pixel, whose X coordinate difference with respect to the first connecting pixel is small, can be selected as the second connecting pixel.

Accordingly, image offset between the first exposure head and the second exposure head can be eliminated merely by controlling the exposure timings of the first connecting pixel and the second connecting pixel and eliminating offset in the Y axis direction.

Note that, other than a slit, a diffraction grating can be used as the slit portion.

Further, in the beam position detecting mechanism, the slit portions can be disposed in the form of the letter V which opens in the X axis direction, the letter X, or the letter T.

A sixth aspect of the present invention provides a pixel position specifying method in an image forming device which forms an image by scanning, in a given direction, a plurality of exposure heads which can selectively turn a plurality of pixels on and off, the method measuring positions of exposure beams of the respective exposure heads and specifying pixel positions of junctures of the exposure heads, the method comprising: measuring a position of an exposure beam by using a beam position detecting mechanism which has at least one pair of slit portions, which are inclined relative to arrangements of pixels of the exposure heads and one of which is disposed along a Y axis direction which is parallel to a scanning direction of the exposure device and another of which is disposed along an X axis direction which is perpendicular to the Y axis direction, and a light amount measuring mechanism which measures light amounts of exposure beams which pass through the slit portions; specifying a position of a first connecting pixel from a pixel position at a time when pixels in a vicinity of a juncture of an image at a first exposure head are successively turned on and a light amount of an exposure beam passing through the one slit portion at the beam position detecting mechanism reaches a peak, and from a pixel position at a time when a light amount of an exposure beam passing through the other slit portion at the beam position detecting mechanism reaches a peak, and from a difference in Y coordinates of the two pixels; and specifying a position of a second connecting pixel from a pixel position at a time when pixels in a vicinity of a juncture of an image at a second exposure head are successively turned on and a light amount of an exposure beam passing through the one slit portion at the beam position detecting mechanism reaches a peak, and from a pixel position at a time when a light amount of an exposure beam passing through the other slit portion at the beam position detecting mechanism reaches a peak, and from a difference in Y coordinates of the two pixels.

In the above-described pixel position specifying method, one of the slit portions of the beam position detecting mechanism is disposed along the Y axis direction, and the other is disposed along the X axis direction, and the slit portions are inclined with respect to the pixel arrangements of the exposure heads.

The pixel, which is lit at the time when the pixels in the vicinity of the juncture of the first exposure head are successively lit in the line direction and the light amount of the exposure beam passing through the slit portion which runs along the Y axis direction is detected and this light amount reaches a peak, is selected as the first connecting pixel. Then, the pixel, which is lit at the time when the pixels in the vicinity of first connecting pixel are successively lit in the column direction and the light amount of the exposure beam passing through the slit portion which runs along the X axis direction is measured and this amount of light reaches a peak, is selected as an auxiliary pixel for specifying the Y axis direction position of the first connecting pixel.

When the first connecting pixel and the auxiliary pixel are selected, the Y coordinate of the first connecting pixel is specified from the Y coordinate of the auxiliary pixel and the difference between the Y coordinates of the auxiliary pixel and the first connecting pixel.

As needed, the beam position detecting mechanism is moved in the Y axis direction and the pixels in a vicinity of the juncture of the second exposure head are successively lit in the line direction, and in accordance with the same processes as in the case of the first connecting pixel, the second connecting pixel and the auxiliary pixel, which is for specifying the Y axis direction position of the first connecting pixel, are selected. The Y coordinate of the second connecting pixel is specified from the Y coordinate of the auxiliary pixel and the difference between the Y coordinates of the auxiliary pixel and the second connecting pixel.

In the step for specifying the first connecting pixel position and the step of specifying the second connecting pixel position, the present pixel position specifying method can specify the positions of the exposure beams without moving the beam position detecting mechanism.

Further, the beam position detecting mechanism only moves along the Y axis direction. Therefore, the X coordinates of the first connecting pixel and the second connecting pixel are the same. Accordingly, offset and overlapping between images of the first exposure head and the second exposure head can be eliminated merely by controlling the exposure timings of the first and second exposure heads in accordance with the scanning speed and the distance, along the Y axis direction, between the first connecting pixel and the second connecting pixel.

A seventh aspect of the present invention is a pixel position specifying method in an image forming device which forms an image by scanning, in a given direction, a plurality of exposure heads which can selectively turn a plurality of pixels on and off, the method measuring positions of exposure beams of the respective exposure heads and specifying pixel positions of junctures of the exposure heads, the method comprising: measuring a position of an exposure beam by using a beam position detecting mechanism which is formed so as to be movable on a reference surface along a Y axis direction and an X axis direction, and which has a first slit portion which is long in the Y axis direction, a second slit portion which is long in the X axis direction, and a light amount measuring mechanism which measures light amounts of exposure beams passing through the first and second slit portions; specifying a position of a first connecting pixel on the basis of a position of the beam position detecting mechanism, at a time when the first connecting pixel in a vicinity of a juncture of an image at a first exposure head is turned on and the beam position detecting mechanism is moved in the X axis direction and the Y axis direction and the light amounts of the exposure beams passing through the first slit portion and the second slit portion reach peaks; and specifying a position of a second specific pixel on the basis of a position of the beam position detecting mechanism, at a time when the second connecting pixel in a vicinity of a juncture of an image at a second exposure head is turned on and the beam position detecting mechanism is moved in the X axis direction and the Y axis direction and the light amounts of the exposure beams passing through the first slit portion and the second slit portion reach peaks.

In the above-described pixel position specifying method, in the steps for specifying the first and the second pixel positions, the beam position detecting mechanism moves in the X axis direction, and senses the exposure beam at the first slit portion. In this way, the X axis direction positions of the first connecting pixel and the second connecting pixel are determined. The beam position detecting mechanism is moved in the Y axis direction, and the exposure beam is sensed at the second slit portion. In this way, the positions, in the Y axis direction, of the first connecting pixel and the second connecting pixel are determined.

Further, also in a case in which the first connecting pixel and the second connecting pixel are set apart in the X axis direction and in the Y axis direction, the actual positions of the both can be specified accurately. Therefore, by controlling the first and second exposure heads so that the images are connected at the first connecting pixel and the second connecting pixel, offset of the images can be eliminated.

An example of the beam position detecting mechanism is a beam detecting device which has, at the non-exposure surface of an exposure stage of multi-exposure heads, a base which can move highly precisely in the X axis direction, and the position of the base can be detected by a linear encoder or the like, and the first slit portion and the second slit portion are provided on the base.

The present invention is a method of correcting image offset in an image forming device which forms an image by scanning, in a given direction, a plurality of exposure heads which can selectively turn a plurality of pixels on and off, the method correcting offset and overlapping between images of the respective exposure heads, the method comprising: specifying positions of a first connecting pixel in a vicinity of a juncture of an image at a first exposure head and a second connecting pixel in a vicinity of a juncture of an image at a second exposure head, by the pixel position specifying method of the fifth aspect; and on the basis of the positions of the first connecting pixel and the second connecting pixel whose pixel positions have been specified, correcting image data inputted to the first exposure head and the second exposure head so that images are connected at the first connecting pixel and the second connecting pixel.

In the above-described method of correcting image offset, in the step of specifying the pixel positions, the actual positions of the first connecting pixel and the second connecting pixel are specified.

Then, in the step of correcting the image data, the image data inputted to the first exposure head and the second exposure head is corrected on the basis of the difference in the specified positions of the first connecting pixel and the second connecting pixel, so that images are connected at the first connecting pixel and the second connecting pixel.

Accordingly, even if the first exposure head and the second exposure head are offset from their initial positions for some reason, offset and overlapping of the images at the juncture portions of the exposure heads due to such offset can be effectively eliminated.

Further, in the image data correcting step, Y axis direction offset between images of the first connecting pixel and the second connecting pixel is eliminated by setting exposure timings of the first exposure head and the second exposure head in accordance with a Y axis direction distance between the first connecting pixel and the second connecting pixel and a scanning speed of the exposure heads, and X axis direction offset between images of the first connecting pixel and the second connecting pixel is eliminated by inputting image data to the first exposure head and the second exposure head so that image data overlap at the first connecting pixel and the second connecting pixel.

The beam position detecting mechanism, which has detected the first connecting pixel, is moved in the Y axis direction, and detects the second connecting pixel. Therefore, although the positions on the Y coordinate of the first connecting pixel and the second connecting pixel are different, their positions on the X coordinate are substantially the same.

Accordingly, if image data is inputted to the first exposure head and the second exposure head so that the image data overlaps at the first connecting pixel and the second connecting pixel, and at the same time, the exposure timings of the first exposure head and the second exposure head are set so that offset in the Y axis direction does not arise, offset and overlapping of the images of the first connecting pixel and the second connecting pixel can be eliminated.

Moreover, also for three or more exposure heads, positions, on the reference surface, of connecting pixels at respective image heads are specified by the pixel position specifying, and the image data inputted to the respective exposure heads is corrected on the basis of the positions of the connecting pixels specified by the pixel position specifying, so that images are connected at the connecting pixels.

Even in an image forming device having a large number of exposure heads, a quality image without offset or overlapping between the exposure heads is formed by correcting the offset or overlapping of the images by the above-described method of correcting image offset, between the one exposure head and the other exposure head whose image is connected to the one exposure head.

An eighth aspect of the present invention provides an image forming device comprising: an exposure mechanism having a plurality of exposure heads which have a mechanism selectively turning a plurality of pixels on and off, and which form an image by exposing while scanning an image forming surface in a given direction; a beam position detecting mechanism detecting positions of exposure beams of the respective exposure heads, the beam position detecting mechanism having at least one pair of slit portions, which are formed so as to be movable on a reference surface along a Y axis direction which is parallel to the scanning direction and which are inclined relative to pixel arrangements of the exposure heads and which intersect one another, and a light amount measuring mechanism which measures light amounts of exposure beams passing through the slit portions; a pixel position specifying mechanism specifying positions of pixels of the exposure heads on the basis of positions of exposure beams detected by the beam position detecting mechanism; and an exposure control mechanism controlling the exposure heads on the basis of the pixel positions specified at the pixel position specifying mechanism, wherein the pixel position specifying mechanism specifies a position of a first connecting pixel on the basis of a position of the beam position detecting mechanism and an angle formed by the slit portions, at a time when the first connecting pixel in a vicinity of a juncture of an image at a first exposure head at the exposure mechanism is turned on and the beam position detecting mechanism is moved along the Y axis direction and light amounts of the exposure beams passing through one slit portion and another slit portion provided at the beam position detecting mechanism reach peaks, and specifies a position of a second connecting pixel on the basis of a position of the beam position detecting mechanism and an angle formed by the slit portions, at a time when the second connecting pixel in a vicinity of a juncture of an image at a second exposure head at the exposure mechanism is turned on and the beam position detecting mechanism is moved along the Y axis direction and light amounts of the exposure beams passing through the one slit portion and the other slit portion reach peaks, and on the basis of the positions of the first connecting pixel and the second connecting pixel which have been specified at the beam position detecting mechanism, the exposure control mechanism corrects image data inputted to the first exposure head and the second exposure head so that images are connected at the first connecting pixel and the second connecting pixel.

In the above-described image forming device, the actual positions of the first connecting pixel and the second connecting pixel are specified by the pixel position specifying method relating to the present invention. On the basis of these positions, the image data inputted to the first exposure head and the second exposure head is corrected, and the images are connected at the first connecting pixel and the second connecting pixel.

Accordingly, even in a case in which the positions of the exposure heads are offset for some reason, offset and overlapping between the images of the exposure heads is corrected automatically. Therefore, offset and overlapping of the images does not arise.

A ninth aspect of the present invention provides an image forming device comprising: an exposure mechanism having a plurality of exposure heads which have a mechanism selectively turning a plurality of pixels on and off, and which form an image by exposing while scanning an image forming surface in a given direction, the pixels of the exposure heads being arranged diagonally with respect to the scanning direction; a beam position detecting mechanism detecting positions of exposure beams of the respective exposure heads, the beam position detecting mechanism having at least one pair of slit portions, which are inclined relative to pixel arrangements of the exposure heads and one of which is disposed along a Y axis direction which is parallel to the scanning direction of the exposure device and another of which is disposed along an X axis direction which is perpendicular to the Y axis direction, and a light amount measuring mechanism which measures light amounts of exposure beams which pass through the slit portions; a pixel position specifying mechanism specifying positions of pixels of the exposure heads on the basis of positions of exposure beams detected by the beam position detecting mechanism; and an exposure control mechanism controlling the exposure heads on the basis of the pixel positions specified at the pixel position specifying mechanism, wherein the pixel position specifying mechanism specifies a position of a first connecting pixel from a pixel position at a time when pixels in a vicinity of a juncture of an image at a first exposure head are successively turned on and a light amount of an exposure beam passing through the one slit portion at the beam position detecting mechanism reaches a peak, and from a pixel position at a time when a light amount of an exposure beam passing through the other slit portion at the beam position detecting mechanism reaches a peak, and from a difference in Y coordinates of the two pixels, and specifies a position of a second connecting pixel from a pixel position at a time when pixels of a second exposure head are successively turned on and a light amount of an exposure beam passing through the one slit portion at the beam position detecting mechanism reaches a peak, and from a pixel position at a time when a light amount of an exposure beam passing through the other slit portion at the beam position detecting mechanism reaches a peak, and from a difference in Y coordinates of the two pixels, and on the basis of the positions of the first connecting pixel and the second connecting pixel which have been specified at the pixel position specifying mechanism, the exposure control mechanism corrects image data inputted to the first exposure head and the second exposure head so that images are connected at the first connecting pixel and the second connecting pixel.

In the above-described image forming device, the actual positions of the first connecting pixel and the second connecting pixel are specified by the pixel position specifying method relating to the present invention.

Accordingly, there is no need to move the beam position detecting mechanism while the positions of the first connecting pixel and the second connecting pixel are being specified. Therefore, the pixel position specifying operation can be made to be even more simple.

A tenth aspect of the present invention provides an image forming device comprising: an exposure mechanism having a plurality of exposure heads which have a mechanism selectively turning a plurality of pixels on and off, and which form an image by exposing while scanning an image forming surface in a given direction; a beam position detecting mechanism formed so as to be movable on a reference surface along a Y axis direction and an X axis direction, the beam position detecting device having a first slit portion which is long in the Y axis direction, a second slit portion which is long in the X axis direction, and a light amount measuring mechanism which measures light amounts of exposure beams passing through the first and second slit portions; a pixel position specifying mechanism specifying positions of pixels of the exposure heads on the basis of positions of exposure beams detected by the beam position detecting mechanism; and an exposure control mechanism controlling the exposure heads on the basis of the pixel positions specified at the pixel position specifying mechanism, wherein the pixel position specifying mechanism specifies a position of a first connecting pixel on the basis of a position of the beam position detecting mechanism, at a time when the first connecting pixel in a vicinity of a juncture of an image at a first exposure head at the exposure mechanism is turned on and the beam position detecting mechanism is moved along the X axis direction and the Y axis direction and light amounts of the exposure beams passing through the first slit portion and the second slit portion reach peaks, and specifies a position of a second connecting pixel on the basis of a position of the beam detecting mechanism, at a time when the second connecting pixel in a vicinity of a juncture of an image at a second exposure head of the exposure mechanism is turned on and the beam position detecting mechanism is moved along the X axis direction and the Y axis direction and light amounts of the exposure beams passing through the first slit portion and the second slit portion reach peaks, and on the basis of the positions of the first connecting pixel and the second connecting pixel which have been specified at the beam position detecting mechanism, the exposure control mechanism corrects image data inputted to the first exposure head and the second exposure head so that images are connected at the first connecting pixel and the second connecting pixel.

In the above-described image forming device, the actual positions of the first connecting pixel and the second connecting pixel are specified by the pixel position specifying method relating to the present invention.

Accordingly, even in a case in which the first connecting pixel and the second connecting pixel are set apart not only in the Y axis direction but also in the X axis direction, the actual positions of the first connecting pixel and the second connecting pixel are specified. By controlling the exposure at the first exposure head and the second exposure head on the basis of these positions, offset and overlapping of the images can be eliminated.

Further, the mechanism for selectively turning the plurality of pixels on and off at the exposure head may comprise a spatial light modulator which modulates light from a light source in accordance with inputted image data, and forms an image.

Moreover, the spatial light modulator is a DMD which has a large number of extremely small reflecting mirrors which reflect the light from the light source and can be set at either of two positions, and the DMD forms pixels by switching a reflection path of the light from the light source by switching positions of the reflecting mirrors to either of the two positions in accordance with the image data.

BRIEF DESCRIPTION OF THE DRAWINGS

FIG. 2 is a perspective view showing the structure of a scanner provided at the exposure device relating to the embodiment of the present invention.

FIG. 27 is an enlarged diagram showing details of the structure of a beam position detecting device provided at the exposure device of FIG. 26.

FIG. 28 is an explanatory diagram showing the process of specifying the XY coordinate of a connecting pixel by the beam position detecting device in the exposure device of FIG. 26.

DETAILED DESCRIPTION OF THE INVENTION

EMBODIMENT 1

Figure 1:
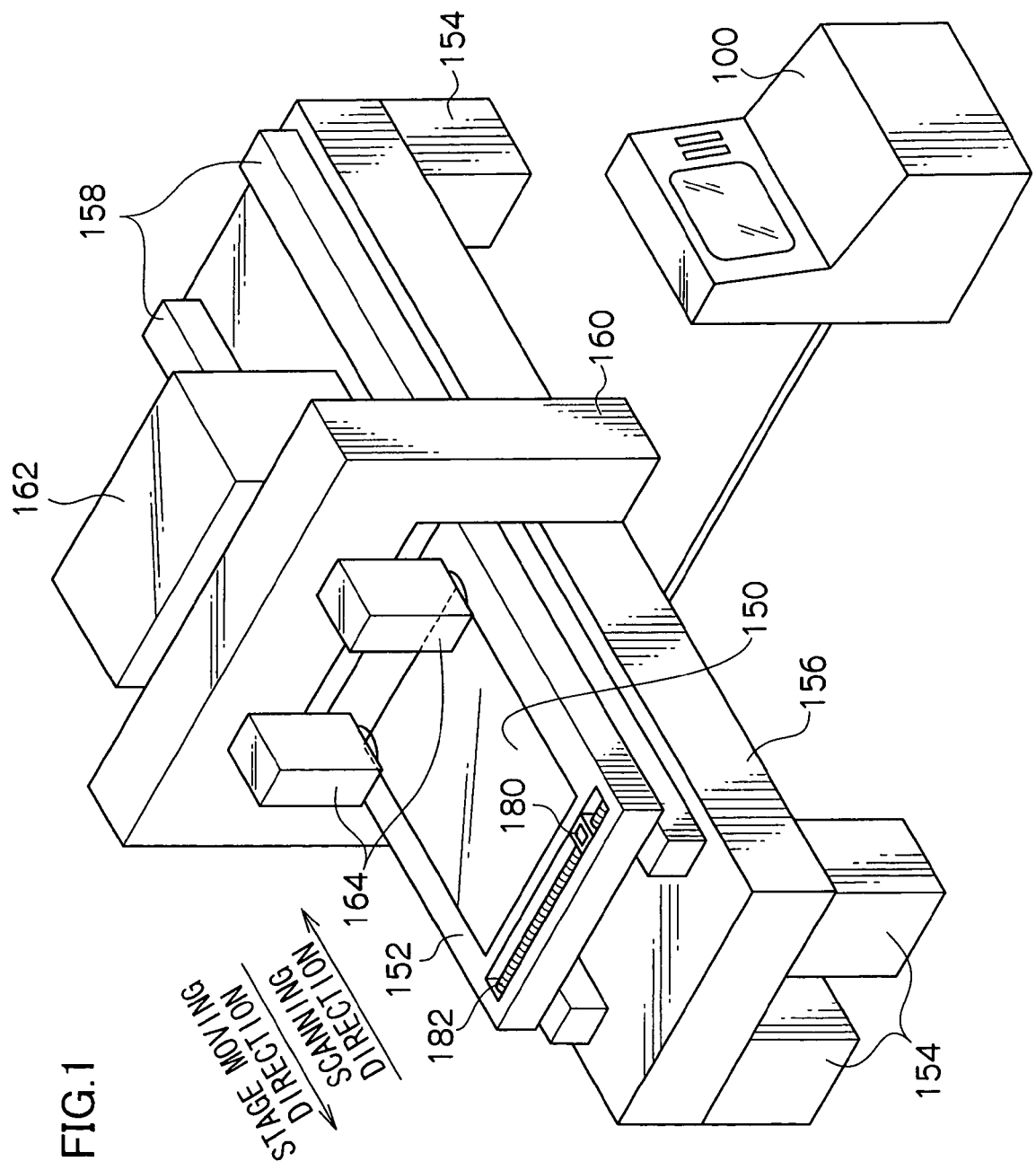
FIG. 1 is a perspective view showing an exposure device relating to an embodiment of the present invention.

The overall structure of an example of an exposure device, which is encompassed by the image forming device of the present invention, is shown in FIG. 1.

The exposure device relating to Embodiment 1 is a so-called flatbed-type exposure device. As shown in FIG. 1, the exposure device has a stage 152 which is shaped as a flat plate, and which attracts and holds a sheet-like photosensitive material 150 to the surface of the stage 152. The surface of the stage 152, which surface attracts and holds the photosensitive material 150, and the exposure surface of the photosensitive material 150 correspond to the image forming surface in the image forming device of the present invention.

The exposure device has a placement stand 156 which is shaped as a thick plate and is supported by four legs 154, and two guides 158 provided on the top surface of the placement stand 156. The guides 158 are disposed along the stage moving direction shown by the arrow in FIG. 1. The stage 152 is disposed such that the longitudinal direction thereof is oriented in the stage moving direction. The stage 152 is supported by the guides 158 so as to be reciprocatingly movable, and moves along the guides 158 due to a driving device (not illustrated).

A U-shaped gate 160 is provided at the central portion of the placement stand 156 so as to straddle over the path of movement of the stage 152. The end portions of the U-shaped gate 160 are fixed to the both side surfaces of the placement stand 156. A scanner 162 is provided at one side surface of the gate 160. A plurality of sensors 164 (e.g., two in the present embodiment), which detect the leading end and the trailing end of the photosensitive material 150, are provided at the other side surface of the gate 160. The scanner 162 and the sensors 164 are respectively mounted to the gate 160, and are disposed so as to be fixed above the path of movement of the stage 152. Note that the scanner 162 and the sensors 164 are connected to a controller 100 which controls them, and, as will be described later, are controlled so as to expose at predetermined times when exposure is carried out by exposure heads 166.

A surface detector 180 is provided at the end portion of the stage 152 at the downstream side in the stage moving direction. The surface detector 180 moves, due to a feed device 182, in the direction perpendicular to the stage moving direction, i.e., along the X axis direction which will be described later. The surface detector 180 is a detector which can specify, in two dimensions, the illuminated position of an exposure beam. The surface detector 180 corresponds to the beam position detecting mechanism in the pixel position specifying method, the method of correcting image offset, and the image forming device relating to the present invention. Further, the surface of the stage 152 corresponds to the reference surface in the pixel position specifying method and the method of correcting image offset. Concretely, a PSD or a quartered photodetector or the like can be used as the surface detector 180. Further, any structure, such as a ball screw, or a belt driving mechanism using a linear guide, or the like, can be used as the feed device 182 provided that it is a linear feed device.

The scanner 162 corresponds to the exposure mechanism in the image forming device relating to the present invention. As shown in FIGS. 2 and 3B, the scanner 162 has a plurality of the exposure heads 166 which are arranged in a substantial matrix form of m lines and n columns (e.g., two lines and five columns in the present embodiment).

As shown in FIG. 2, an exposure region 168, which is a region exposed by the exposure head 166, is in the shape of a rectangle whose short side runs along the scanning direction. The exposure region 168 is inclined by a predetermined angle θ with respect to the scanning direction. As the stage 152 moves, a strip-shaped exposed region 170 is formed on the photosensitive material 150 by each of the exposure heads 166. Note that, as shown in FIGS. 1 and 2, the scanning direction is opposite to the stage moving direction.

Figure 3A:
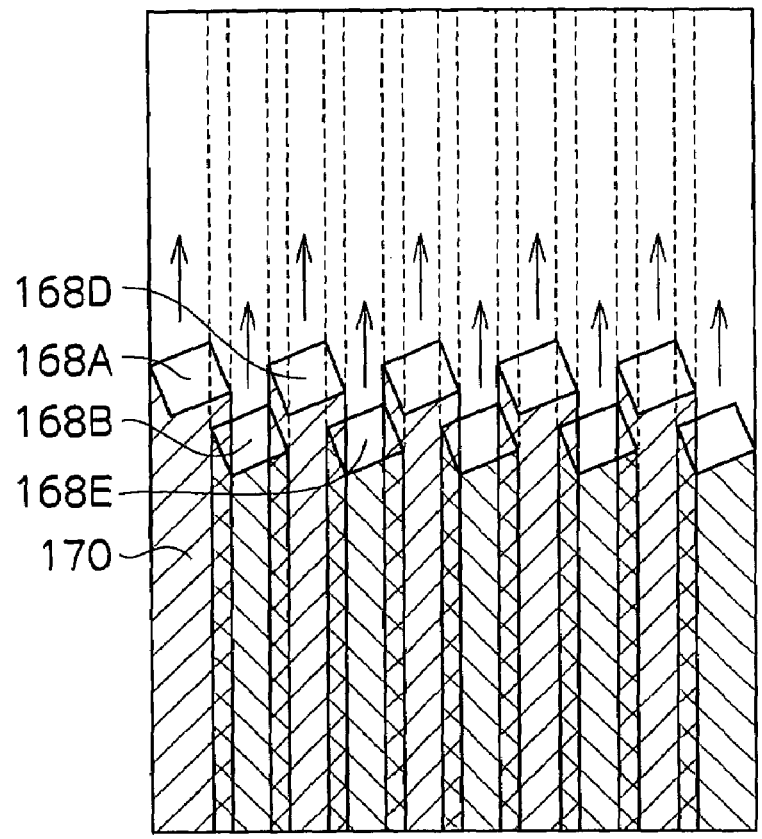
FIG. 3A is a plan view showing exposed regions formed on a photosensitive material.
Figure 3B:
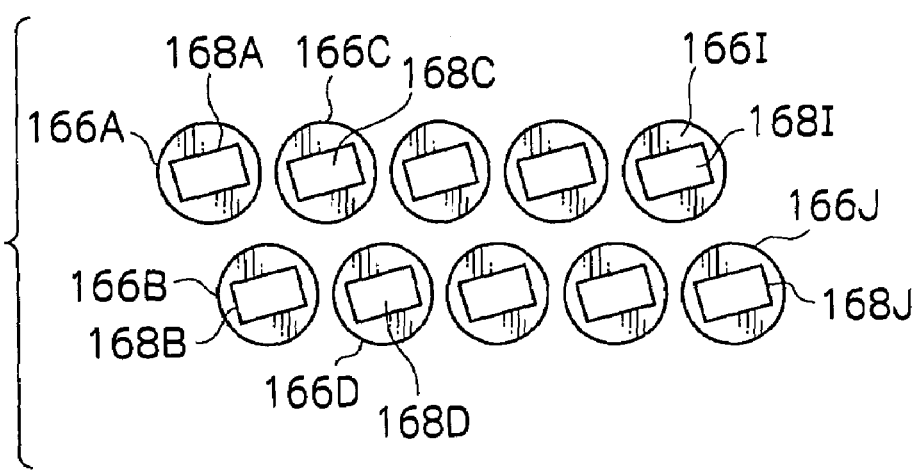
FIG. 3B is a schematic diagram showing the arrangement of the exposure regions by respective exposure heads.

As shown in FIGS. 3A and 3B, the exposure heads 166 are lined up in the form of lines, and each of the strip-shaped exposed regions 170 is disposed so as to be offset by a predetermined interval in the lined-up direction (a natural number multiple of the long side of the exposure region (a multiple of one in the present embodiment)), such that adjacent exposed regions 170 partly overlap one another. The exposure heads 166 correspond to the SLM exposure heads in the image forming device of the present invention.

As shown in FIG. 1, the controller 100, which controls moving of the stage 152 and the exposure at the respective exposure heads 166 and the like, is connected to the exposure device relating to Embodiment 1. The controller 100 corresponds to the exposure control mechanism provided at the image forming device relating to the present invention.

Figure 4:
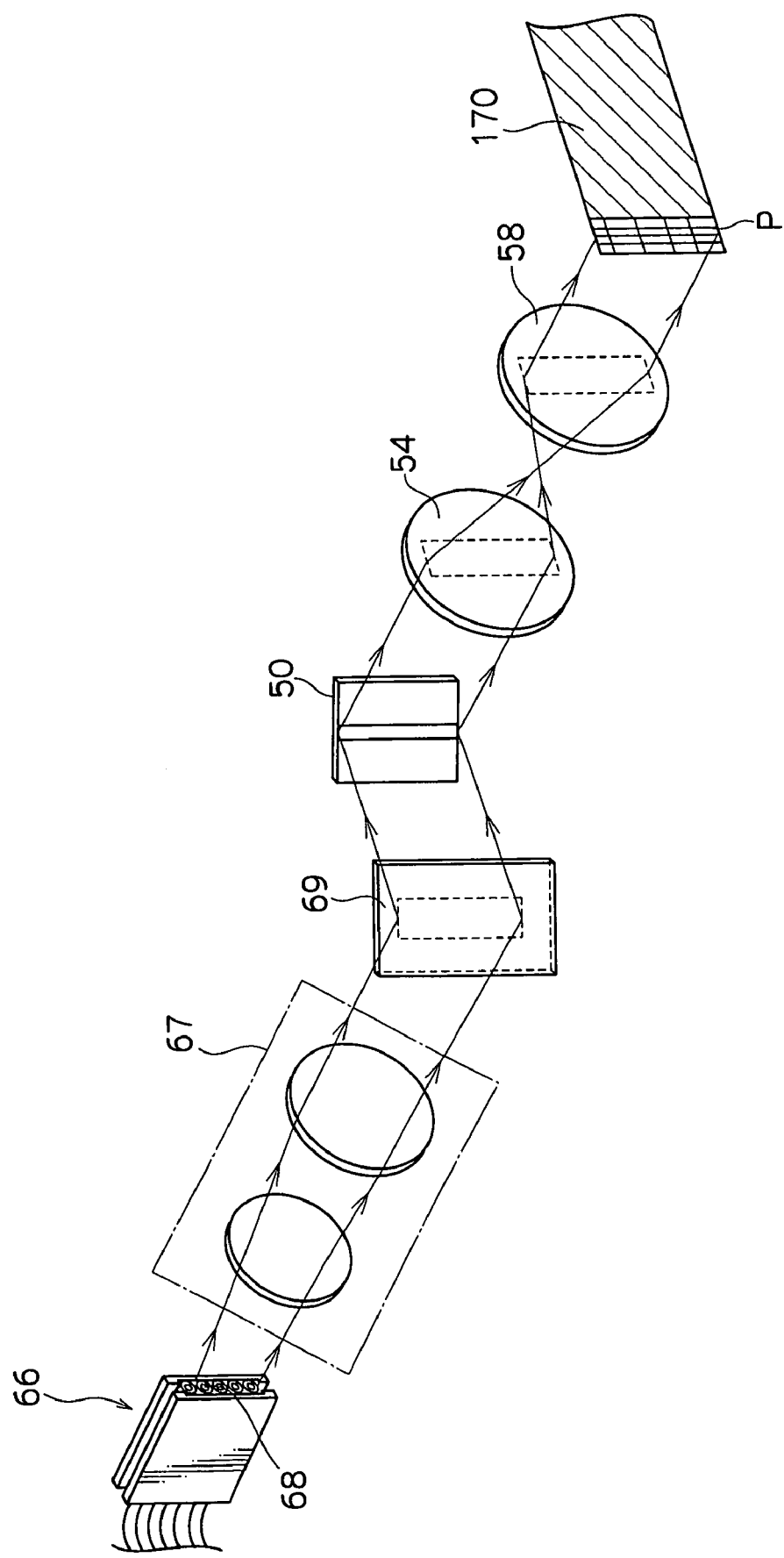
FIG. 4 is a perspective view showing the schematic structure of the exposure head provided at the exposure device relating to the embodiment of the present invention.
Figure 5A:
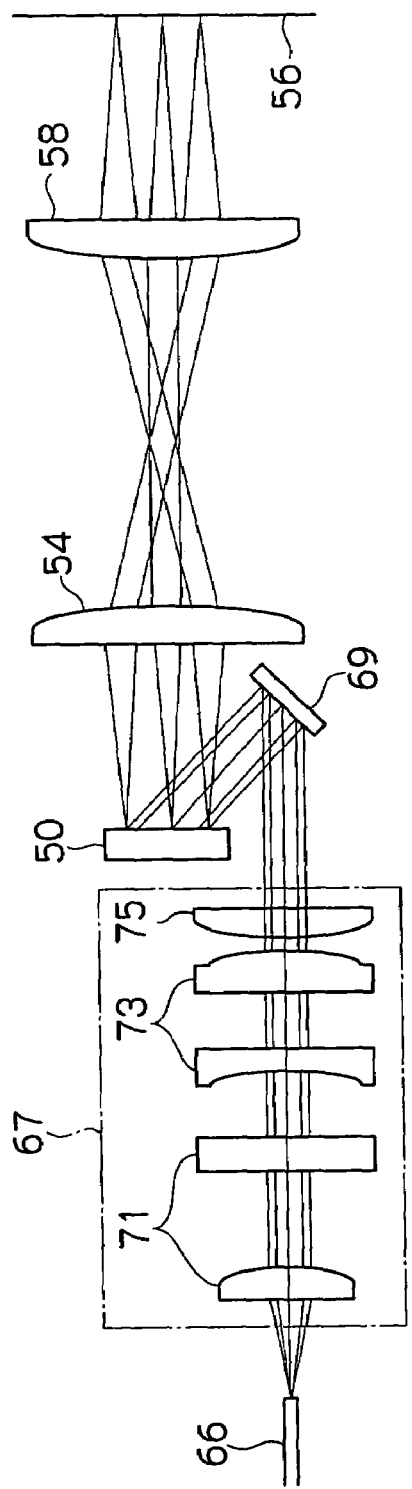
FIG. 5A is a sectional view of a scanning direction taken along an optical axis and showing the structure of the exposure head shown in FIG. 4.
Figure 5B:
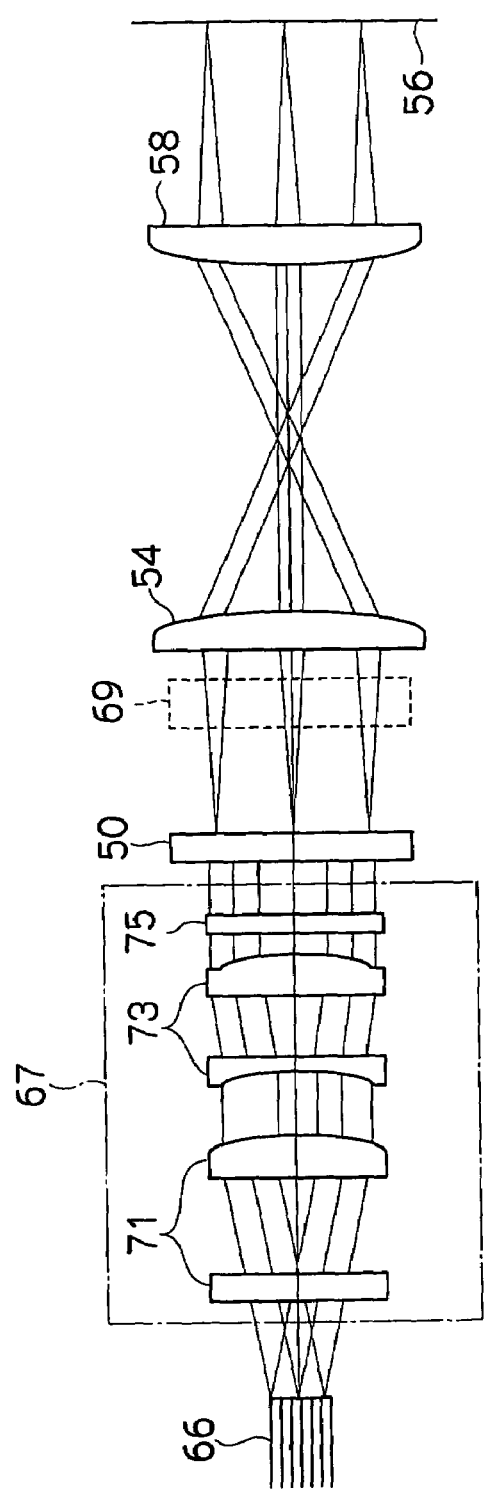
FIG. 5B is a sectional view of a scanning direction taken along an optical axis and showing the structure of the exposure head shown in FIG. 4.

As shown in FIGS. 4, 5A, and 5B, each of exposure heads 166A through 166J has a DMD 50 serving as an SLM which modulates the incident light beam on a pixel-by-pixel basis and in accordance with image data. The DMD 50 is connected to a controller (not illustrated) which has a data processing portion and a mirror driving controlling portion. A control signal, which drives and controls each micromirror within a region to be controlled of the DMD 50 for each exposure head 166, is generated in the data processing portion of this controller on the basis of the inputted image data.

In the mirror driving controlling portion, the angle of the reflecting surface of each micromirror of the DMD 50 is controlled for each of the exposure heads 166 on the basis of the control signal generated at the image data processing portion. Note that the control of the angles of the reflecting surfaces will be described later.

A fiber array light source 66, a lens system 67, and a reflecting mirror 69 are disposed in that order at the light incident side of the DMD 50. The fiber array light source 66 has a laser exiting portion at which the light exiting end portions (light emitting points) of optical fibers are lined up in one row along a direction corresponding to the direction of the long side of the exposure region 168. The lens system 67 corrects the laser light exiting from the fiber array light source 66, and collects it on the DMD. The reflecting mirror 69 reflects the laser light, which has passed through the lens system 67, toward the DMD 50.

The lens system 67 is structured by a pair of combination lenses 71, a pair of combination lenses 73, and a collecting lens 75. The pair of combination lenses 71 make the laser light exiting from the fiber array light source 66 into parallel light. The pair of combination lenses 73 carry out correction such that the light amount distribution of the laser light which has been made into parallel light is uniform. The collecting lens 75 collects the laser light, whose light amount distribution has been corrected, on the DMD. The combination lenses 73 have the following functions: with regard to the direction in which the laser exiting ends are lined up, the portions of the combination lenses 73 near to the optical axis of the lenses widen the bundle of light, and the portions away from the optical axis narrow the bundle of light, whereas, with regard to the direction perpendicular to the lined-up direction, the combination lenses 73 make the light pass through as is. The combination lenses 73 correct the laser light such that the light amount distribution thereof becomes uniform.

Lens systems 54, 58 are disposed at the light reflecting side of the DMD 50. The lens systems 54, 58 focus the laser light, which has been reflected at the DMD 50, onto a scan surface (surface-to be-exposed) 56 of the photosensitive material 150. The lens systems 54, 58 are disposed such that the DMD 50 and the surface-to be-exposed 56 are set in a conjugate relationship.

The present embodiment is set such that the laser light emitted from the fiber array light surface 66 is formed such that the pixels on the DMD 50 are illuminated uniformly, and thereafter, the respective pixels are enlarged by about five times by the lens systems 54, 58.

Figure 6:
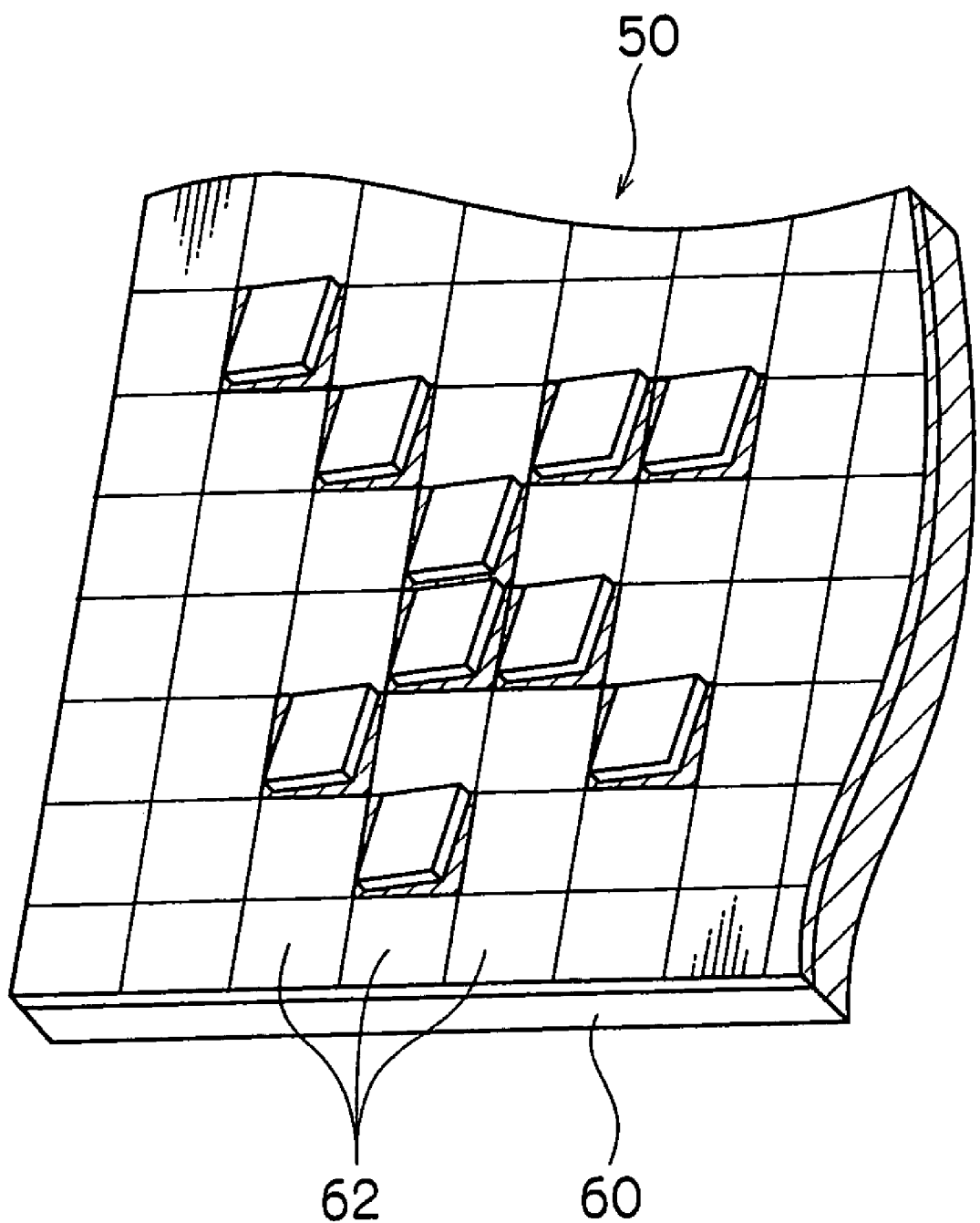
FIG. 6 is a partial enlarged diagram showing the structure of a DMD provided at the exposure head shown in FIG. 4.

As shown in FIG. 6, the DMD 50 is a mirror device in which extremely small mirrors (micromirrors) 62 are disposed on an SRAM cell (a memory cell) 60 so as to be supported by supports, and the large number (e.g., 1024× 768, at a pitch of 13.86 μm) of extremely small mirrors which structure the pixels are arrayed in the form of a grid. The micromirror 62, which is supported by the support at the topmost portion of the pixels, is provided at each pixel. A material having high reflectivity, such as aluminum or the like, is evaporated on the surface of the micromirror 62. The reflectivity of the micromirror 62 is 90% or more. Further, the SRAM cell 60 of a silicon gate CMOS, which is manufactured on a usual production line for semiconductor memories, is disposed directly beneath the micromirrors 62 via the supports including hinges and yokes, so as to be structured monolithically overall.

Figure 7A:
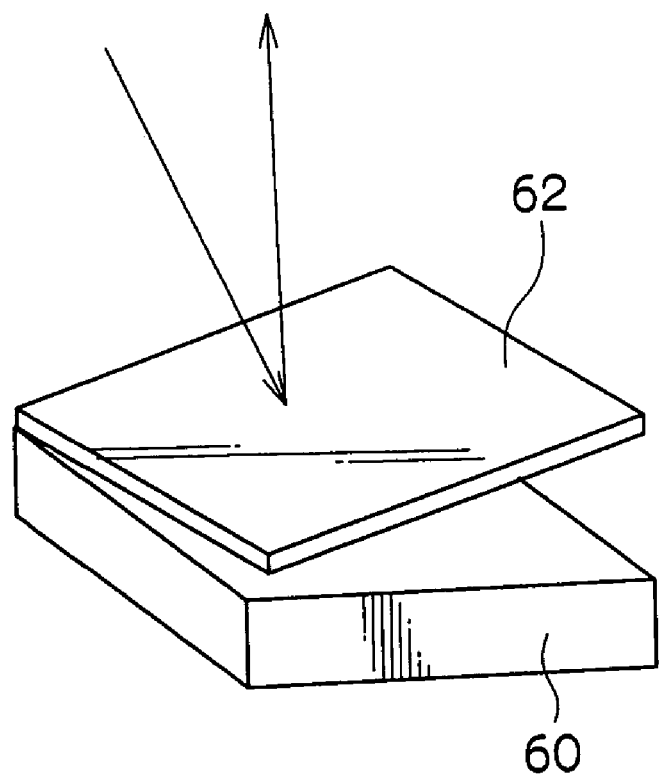
FIG. 7A is an explanatory diagram showing operation of the DMD shown in FIG. 6.
Figure 7B:
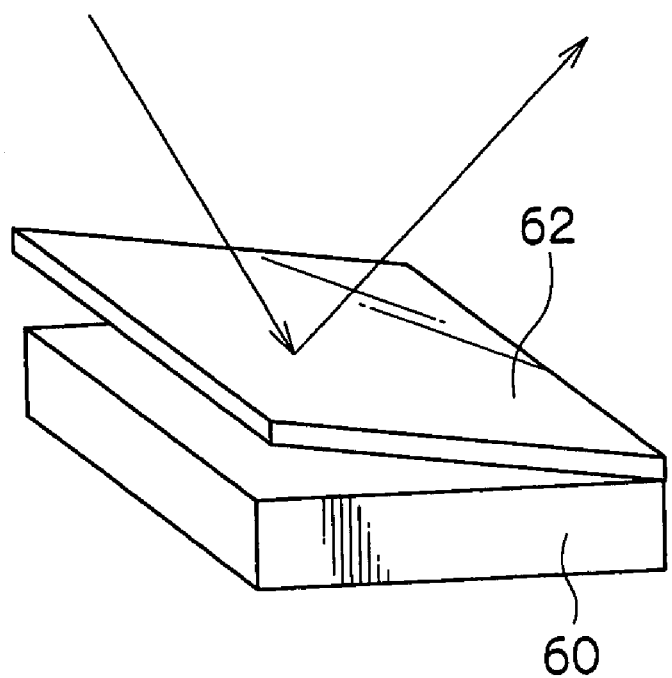
FIG. 7B is an explanatory diagram showing operation of the DMD shown in FIG. 6.

Digital signals expressing the inclined states (modulating states) of the micromirrors 62 are written to the SRAM cell 60 of the DMD 50. When the digital signals are outputted to the micromirrors 62 from the SRAM cell 60, the micromirrors 62, which are supported by the supports, are tilted, around diagonal lines, within a range of ±α° (e.g., ±10°) with respect to the substrate on which the DMD 50 is disposed. FIG. 7A illustrates a state in which the micromirror 62 is tilted by +α° which is the on state. FIG. 7B illustrates a state in which the micromirror 62 is tilted by −α° which is the off state. Accordingly, by controlling, as shown in FIGS. 6, 7A and 7B, the inclinations of the micromirrors 62 at the respective pixels of the DMD 50 in accordance with the image signal, the light incident on the DMD 50 is reflected in the directions of tilting of the respective micromirrors 62.

Note that the on/off control of the respective micromirrors 62 is carried out by a controller (not shown) which is connected to the DMD 50. A light absorbing body (not shown) is disposed in the direction in which the light beams are reflected by the micromirrors 62 which are in their off states.

As described above, at the scanner 162, the first line and the second line of the exposure heads 166A through 166J are disposed so as to be offset in the column direction by a predetermined interval toward the right, as shown in FIGS. 3A and 3B.

Accordingly, for example, the unexposed portion between a left-most exposure region 168A in the first line and an exposure region 168C positioned next to the exposure region 168A at the right side thereof, is exposed by an exposure region 168B which is positioned below and to the right of the exposure region 168A. Similarly, the unexposed portion between the exposure region 168B and an exposure region 168D adjacent to the exposure region 168B, is exposed by the exposure region 168C which is positioned above and to the right of the exposure region 168B. The same holds for regions thereafter. In this way, when a single continuous image is formed on the surface of the photosensitive material 150 by the exposure heads 166A through 166J, the image must be connected between the respective exposure regions and the exposure regions positioned at the right sides thereof. Hereinafter, description will be given with reference to FIG. 8 by using, as an example, a case in which the image is connected between the exposure region 168A and the exposure region 168B. Hereinafter, the conveying direction of the photosensitive material 150 is the Y axis direction, and the direction perpendicular to the conveying direction is the X axis direction.

First, the stage 152 is moved so that the detector 180 is positioned at the exposure region 168A, and the detector 180 is moved by the feed device 82.

Next, a connecting pixel P1, which is a pixel formed at the exposure region 168A by the exposure beam from the exposure head 166A and which connects with the image formed at the exposure region 168B, is selected and lit. The number of the connecting pixels P1 may be only one, or may be two or more. The connecting pixel P1 corresponds to the first connecting pixel in the present invention.

Then, the connecting pixel P1 is detected by the detector 180 (first exposure beam position detection). The position of the connecting pixel P1 on the detector 180 at the time when the connecting pixel P1 is detected by the detector 180 is (x1, y1).

Next, at the exposure head 166B, pixels P, for which there is the possibility that the pixels P may be connected to the exposure region 168A, are selected and lit. Then, the stage 152 is moved until any one of these pixels is detected. In other words, the detector 180 is moved along the Y axis direction (second exposure beam position detection). The amount of movement of the stage 152 at the time when this pixel is detected at the exposure region 168B, i.e., the amount of movement of the detector 180, is Y0.

Among the pixels P of the exposure head 166B detected by the detector 180, the pixel whose distance in the X axis direction to the connecting pixel P1 is the smallest is selected as connecting pixel P2. The coordinate of the connecting pixel P2 on the detector 180 is (x2, y2).

Figure 8:
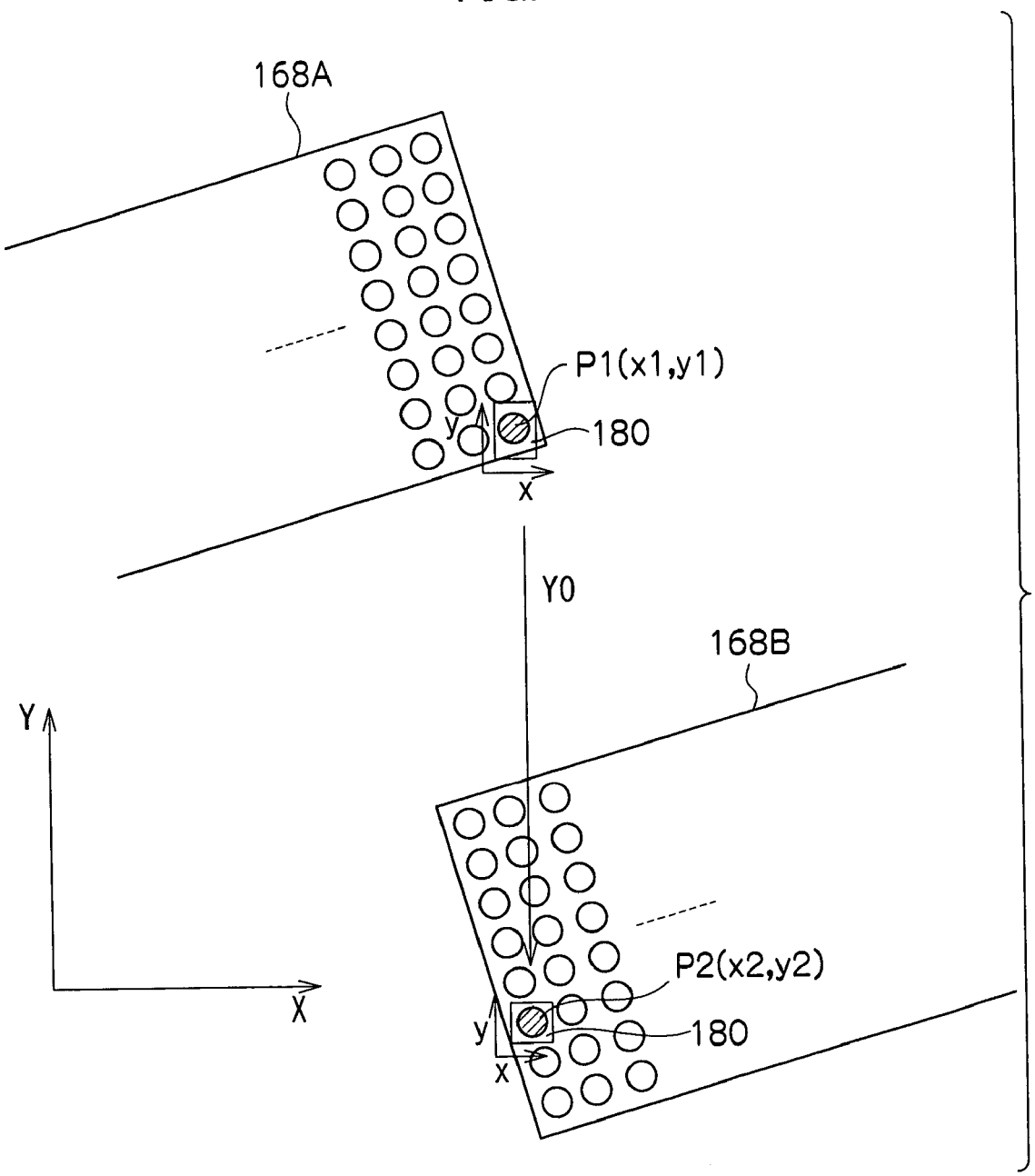
FIG. 8 is a plan view showing the processes of selecting connecting pixels from pixels at exposure heads provided at the exposure device relating to the embodiment of the present invention, and of connecting the images.

As described above, after the connecting pixel P1 (x1, y1) is detected, the detector 180 is moved in the Y axis direction, and the connecting pixel P2 (x2, y2) is detected. Namely, the X coordinates of the detector 180 at the time of detecting the connecting pixel P1 (x1, y1) and at the time of detecting the connecting pixel (x2, y2) are the same. Further, the x axis and y axis on the detector are parallel to the X axis and the Y axis, respectively, as shown in FIG. 8. Accordingly, the distance, in the X axis direction, between the connecting pixel P1 and the connecting pixel P2 is given by the difference x2−x1 in the positions on the x coordinate. On the other hand, the distance in the Y axis direction is given by the result of adding the moving distance Y0 of the detector 180 in the Y axis direction to the difference y2−y1 in the positions on the y coordinate, i.e., y2−y1+Y0.

Here, the controller 100 sets the exposure timings of the exposure head 166A and the exposure head 166B in accordance with the distance (x2−x1, y2−y1+Y0) between the connecting pixel P1 and the connecting pixel P2 and the conveying speed of the photosensitive material 150 (i.e., the moving speed V of the stage 152), such that the image offset between the connecting pixel P1 and the connecting pixel P2 is a minimum. Further, the image data is inputted to the exposure head 166A and to the exposure head 166B so that the images overlap at the connecting pixel P1 and the connecting pixel P2. As needed, correction such as image data shifting, image rotation, magnification conversion, or the like is carried out on the inputted image data.

Figure 9:
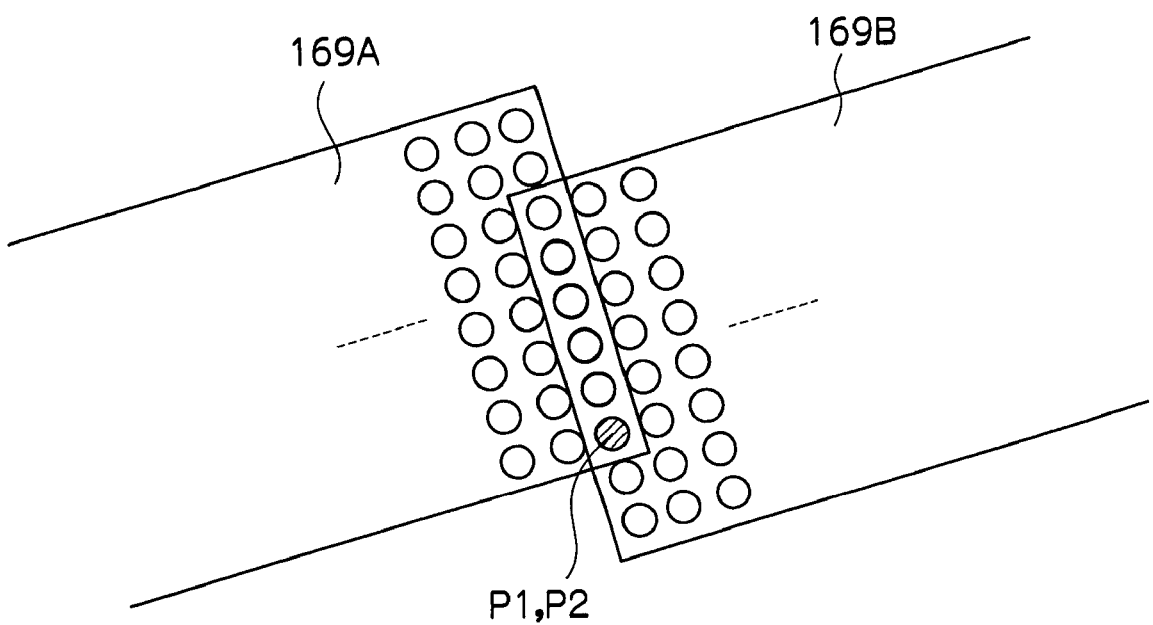
FIG. 9 is plan view showing an example of images connected by the processes shown in FIG. 8.

The images formed on the photosensitive material 150 when the exposure timings of the exposure head 166A and the exposure head 166B are set as described above, is shown in FIG. 9. In FIG. 9, an image 169A is an image formed on the photosensitive material 150 by the exposure head 166A, and an image 169B is an image formed on the photosensitive material 150 by the exposure head 166B.

As is clear from FIG. 9, the X axis direction positions of the connecting pixel P1 and the connecting pixel P2, which connect the image 169A and the image 169B, are about the same. Further, by correcting or the like the exposure timings of the exposure head 166A and the exposure head 166B, Y axis direction offset or overlapping between the connecting pixel P1 and the connecting pixel P2 does not arise. Accordingly, at the image 169A and the image 169B, there is hardly any offset or overlapping at the juncture.

Next, the detector 180 is driven by the feed device 182, and moves to the juncture between the exposure head 166B and the exposure head 166C. Connecting pixels of the image 169B and an image 169C, which are formed at the exposure head 166B and the exposure head 166C respectively, are specified in accordance with the same processes used for the exposure head 166A and the exposure head 166B. By successively repeating these processes, the connecting pixels of all of the exposure heads 166 of the exposure device are specified, and the image data inputted to the respective exposure heads 166 is subjected to correction such as image data shifting, image rotation, magnification conversion, or the like so that the images overlap at the connecting pixels. In this way, it is possible to form an image which has little offset or overlapping at the junctures over the entire exposure region.

In this way, in the exposure device relating to Embodiment 1, even if the positions between the exposure heads 166A through 166J change due to thermal expansion or thermal contraction of the respective members due to changes in temperature, and due to the accumulation of changes over time due to usage over a long period of time, offset and overlapping of the images at the junctures of the images 169A through 169J formed by the exposure heads 166A through 166J can be kept to a minimum. Therefore, even in a case of forming an image having a large surface area, a quality image in which junctures and offset are not conspicuous can be obtained.

Accordingly, even if the photosensitive material 150 has a large surface area, an image of high quality can be formed. Therefore, even in cases in which the exposure device is applied to the manufacture of large-surface-area printed circuit boards, TFTs, color filters of liquid crystal display devices, and plasma display panels, the production of defective products due to offset between the images of the exposure heads 166 can effectively be prevented.

EMBODIMENT 2

Figure 10:
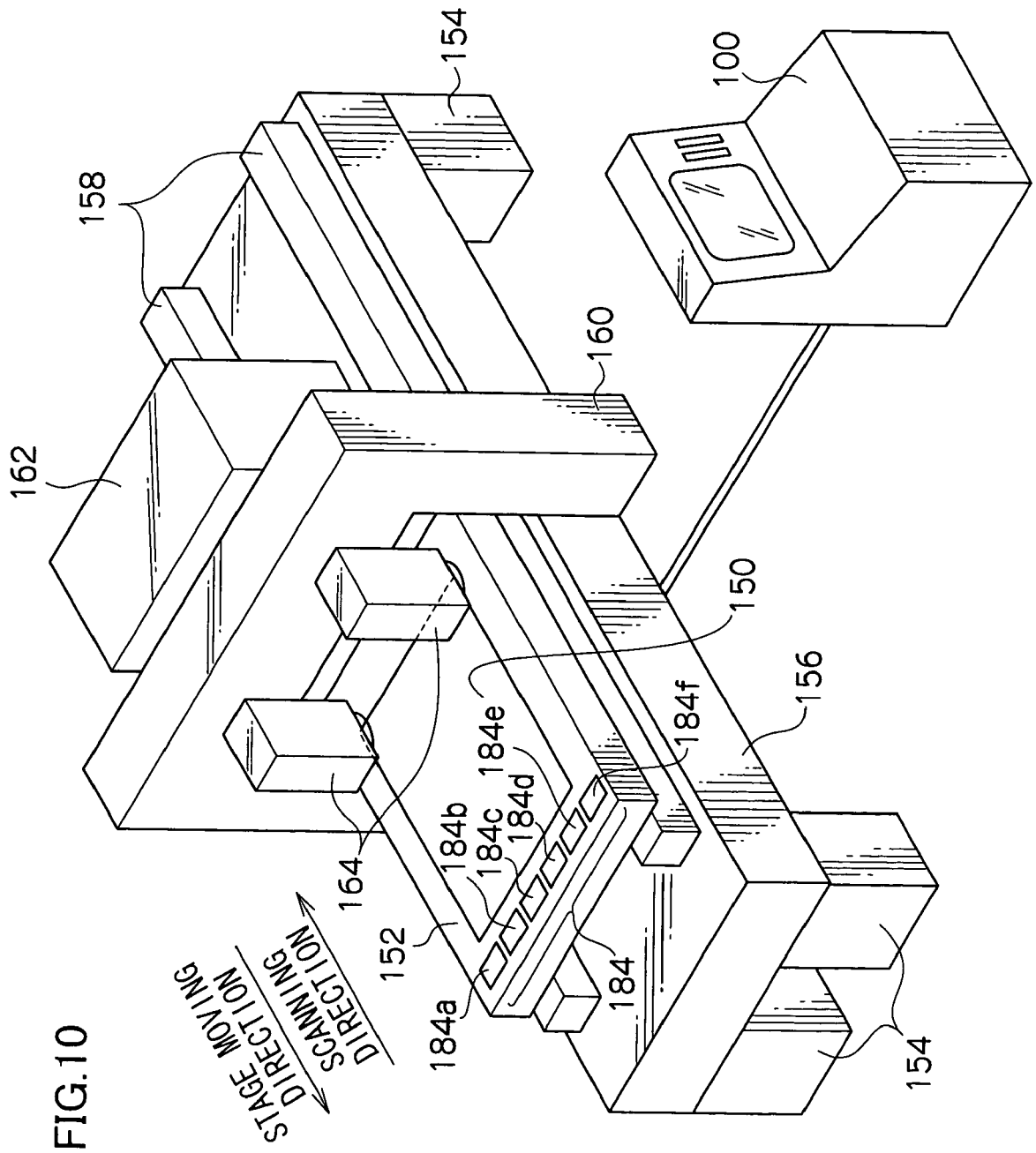
FIG. 10 is a perspective view showing the structure of an exposure device relating to another embodiment of the present invention.

The overall structure of another example of the exposure device encompassed by the image forming device of the present invention is shown in FIG. 10. Note that description of structures which are similar to those of Embodiment 1 is omitted. Further, reference numerals which are the same as in Embodiment 1 as a rule denote the same structural elements.

In the same way as the exposure device relating to Embodiment 1, the exposure device relating to Embodiment 2 is a flatbed-type exposure device. As shown in FIG. 10, the exposure device has the stage 152 which is shaped as a flat plate, and which attracts and holds the sheet-like photosensitive material 150 to the surface of the stage 152.

Instead of the detector 180 provided in the exposure device relating to Embodiment 1, a surface detector 184 is disposed at the end portion of the stage 152 at the downstream side in the stage moving direction. The surface detector 184 has six surface detectors 184a through 184f which are fixed along the X axis direction, i.e., along the direction perpendicular to the stage moving direction. The surface detector 184 corresponds to the beam position detecting mechanism in the present invention. The surface detector 184 is similar to the surface detector 180 in Embodiment 1. Further, the x axis and the y axis on the plane of detection of the surface detector 184 are parallel to the X axis and the Y axis of the exposure device, respectively. Accordingly, the pixels of the exposure heads 166 are arrayed diagonally with respect to the x axis and the y axis of the surface detector 184.

Hereinafter, description will be given of the processes for selecting the connecting pixel P1 and the connecting pixel P2 at the exposure region 168A and the exposure region 168B.

First, the stage 152 is moved, and the surface detector 184 is positioned beneath the exposure region 168.

Figure 11A:
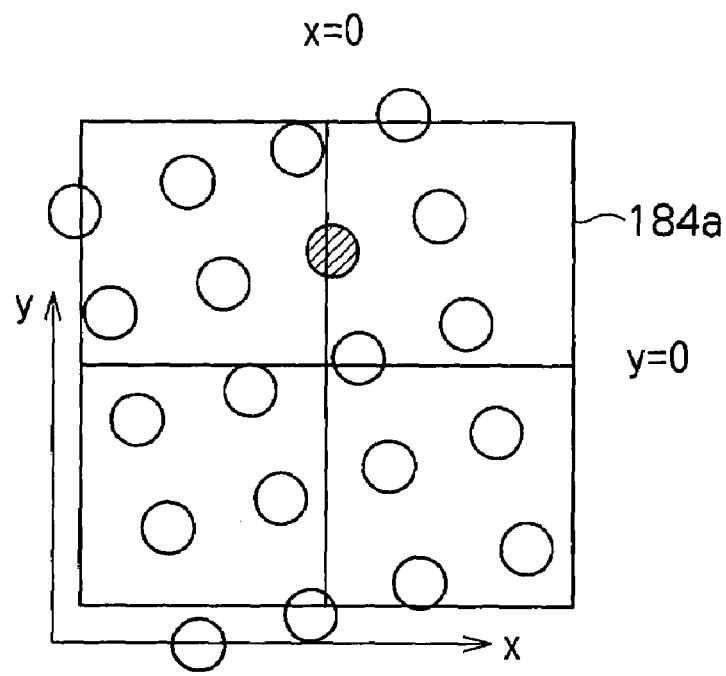
FIGS. 11A and 11B are plan views showing the processes of selecting connecting pixels from pixels at exposure heads provided at the exposure device relating to FIG. 10, and of connecting the images.
Figure 11B:
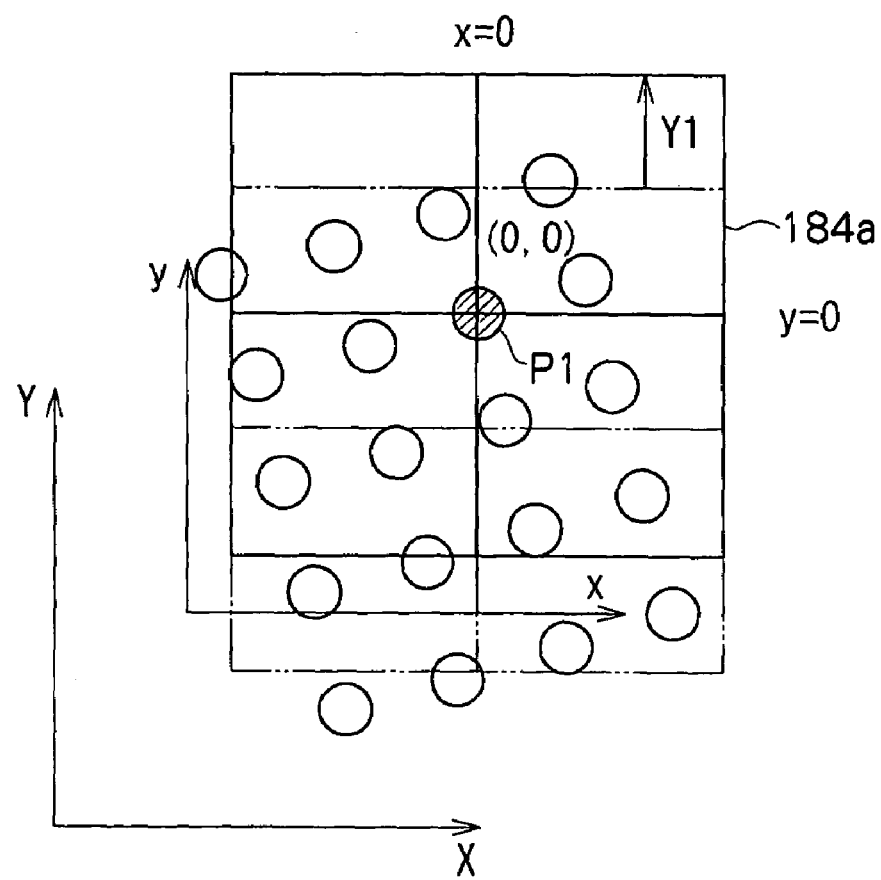

Next, at the exposure region 168A, the pixels of the exposure head 166A are successively lit, and as shown in FIG. 11A, the pixels are detected by one of surface detectors 184a through 184f. Hereinafter, for the sake of simplicity, explanation will be given of, as an example, a case in which the pixels are detected by the surface detector 184a.

When the pixels are detected at the surface detector 184a, among these pixels, the pixel which is closest to the position x=0 of the surface detector 184 is made to be the connecting pixel P1 (a, b). Note that (a, b) is the position of the connecting pixel P1 on the xy plane.

Next, the stage 152 is moved, i.e., the surface detector 184 is moved in the Y axis direction such that the connecting pixel P1 is positioned on the y=0 line of the detector 184a, and the amount of movement Y1 of the stage 152 at this time is detected. This Y1 corresponds to the y coordinate b of the connecting pixel P1 before the detector 184 was moved. Accordingly, the xy coordinate of the connecting pixel P1 is specified as (a, Y1).

When the xy coordinate of the connecting pixel P1 has been set, in the same way as at the time of P1, the pixels of the exposure head 166B are successively lit. The pixel which is closest to the position x=0 of the detector 184a at the exposure region 168B is the connecting pixel P2 (c, d). Note that (c, d) is the position of the connecting pixel P2 on the xy plane.

Then, the stage 152 is moved, the connecting pixel P2 is positioned on the origin (0, 0) of the detector 184a, and the amount of movement Y2 of the stage 152 at this time is detected. This Y2 corresponds to the y coordinate d of the connecting pixel P2 before the detector 184a was moved. Accordingly, the xy coordinate of the connecting pixel P2 is specified as (c, Y2).

Here, the connecting pixel P1 and the connecting pixel P2 are the pixels which are the closest to the position x=0 of the surface detector 184a. Therefore, the distance in the x axis direction, i.e., the distance in the X axis direction, is almost 0.

Accordingly, when the connecting pixel P1 and the connecting pixel P2 are selected and the xy coordinates are specified, the controller 100 sets the exposure timings of the exposure head 166A and the exposure head 166B in accordance with the Y axis direction distance (Y2−Y1) between the connecting pixel P1 and the connecting pixel P2 and the conveying speed of the photosensitive material 150 (i.e., the moving speed V of the stage 152), such that the images overlap in the Y axis direction at the connecting pixel P1 and the connecting pixel P2. At the same time, the image data is inputted to the exposure head 166A and the exposure head 166B such that the same image is formed at the connecting pixel P1 and the connecting pixel P2 in the X axis direction.

In this way, as shown in FIG. 9, offset and overlapping between the image 169A and the image 169B can be prevented.

In the exposure device relating to Embodiment 2, the connecting pixels P1 and P2, whose X axis direction positions are substantially the same, are selected as the connecting pixels, and the image data is converted such that the images overlap at the connecting pixel P1 and the connecting pixel P2. Therefore, even more than the exposure device relating to Embodiment 1, it is possible to form an image in which there is little offset or overlapping at the junctures of the image.

Next, by the same processes, the connecting pixels of the image 169B and the image 169C formed by the exposure head 166B and the exposure head 166C, respectively, are specified by the detector 184b. By successively repeating these processes, connecting pixels between all of the exposure heads of the exposure device are specified, and the image data inputted to the respective exposure heads 166 is subjected to correction such as image data shifting, image rotation, magnification conversion, or the like so that the images overlap at the connecting pixels. In this way, it is possible to form an image which has little offset or overlapping at the junctures over the entire exposure region.

Accordingly, even in cases in which the exposure device is applied to the manufacture of large-surface-area printed circuit boards, TFTs, color filters of liquid crystal display devices, and plasma display panels, the production of defective products due to offset between the images of the exposure heads 166 can be even more effectively prevented.

EMBODIMENT 3

Figure 12:
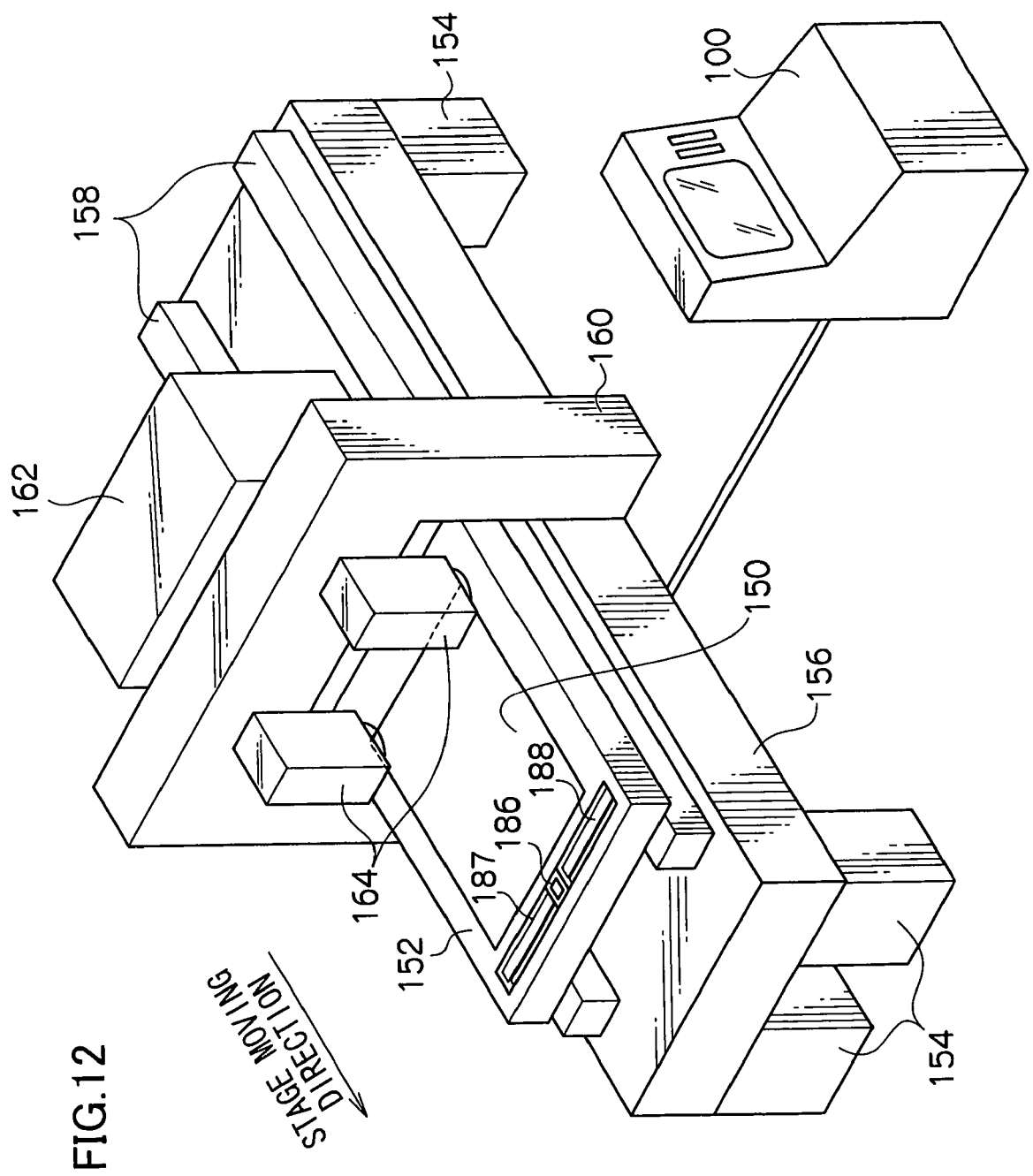
FIG. 12 is a perspective view showing the structure of an exposure device relating to yet another embodiment of the present invention.

The overall structure of yet another example of the exposure device encompassed by the image forming device of the present invention is shown in FIG. 12. Note that description of structures which are similar to those of Embodiment 1 is omitted. Further, reference numerals which are the same as in Embodiment 1 as a rule denote the same structural elements.

In the same way as the exposure device relating to Embodiment 1, the exposure device relating to Embodiment 3 is a flatbed-type exposure device. As shown in FIG. 12, the exposure device has the stage 152 which is shaped as a flat plate, and which attracts and holds the sheet-like photosensitive material 150 to the surface of the stage 152.

Figure 13:
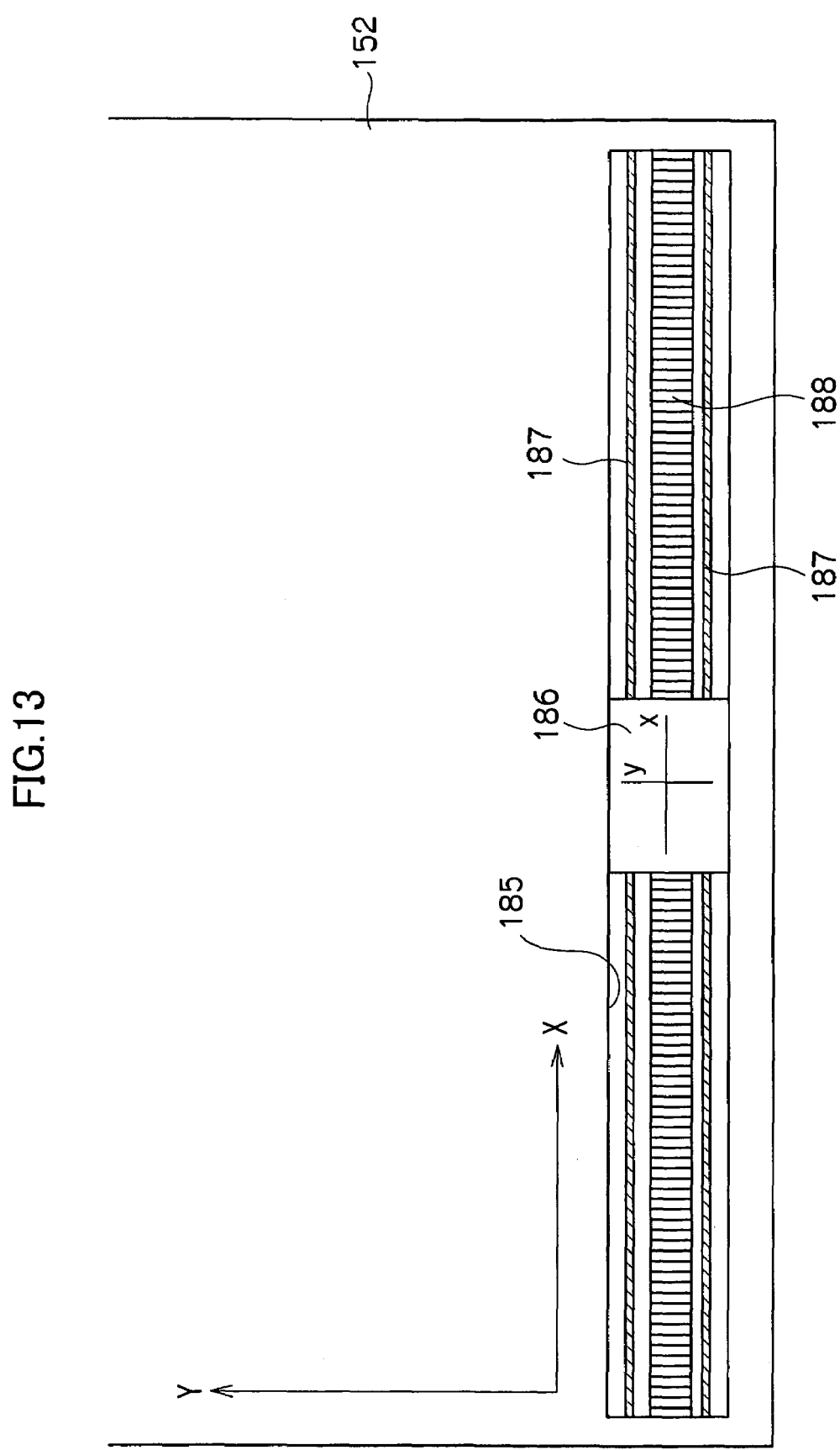
FIG. 13 is an enlarged plan view showing details of a surface detector provided at the exposure device relating to FIG. 12, and of the structure at the periphery of the surface detector.

A surface detector 186, which can move along the X axis direction by highly-precise feed devices 187, is disposed at the end portion of the stage 152 at the downstream side in the stage moving direction. As shown in FIG. 13, a groove 185 is provided in the downstream side end portion of the stage 152 along the X axis direction along the entire width. The surface detector 186 slides within the groove 185. A linear encoder 188, which detects the X axis direction position of the surface detector 186, is provided in the groove 185. Two of the feed devices 187 which feed the surface detector 186 are provided so as to sandwich the linear encoder 188 therebetween. Ball screws or linear motors or the like can be used as the feed devices 187. Note that, when ball screws are used as the feed devices 187, if a pulse motor is used to drive the ball screws, the position of the surface detector 186 can be specified from the number of pulses fed to the pulse motor and from the moving distance of the surface detector 186 per pulse. Accordingly, the linear encoder 188 is not needed.

Figure 14:
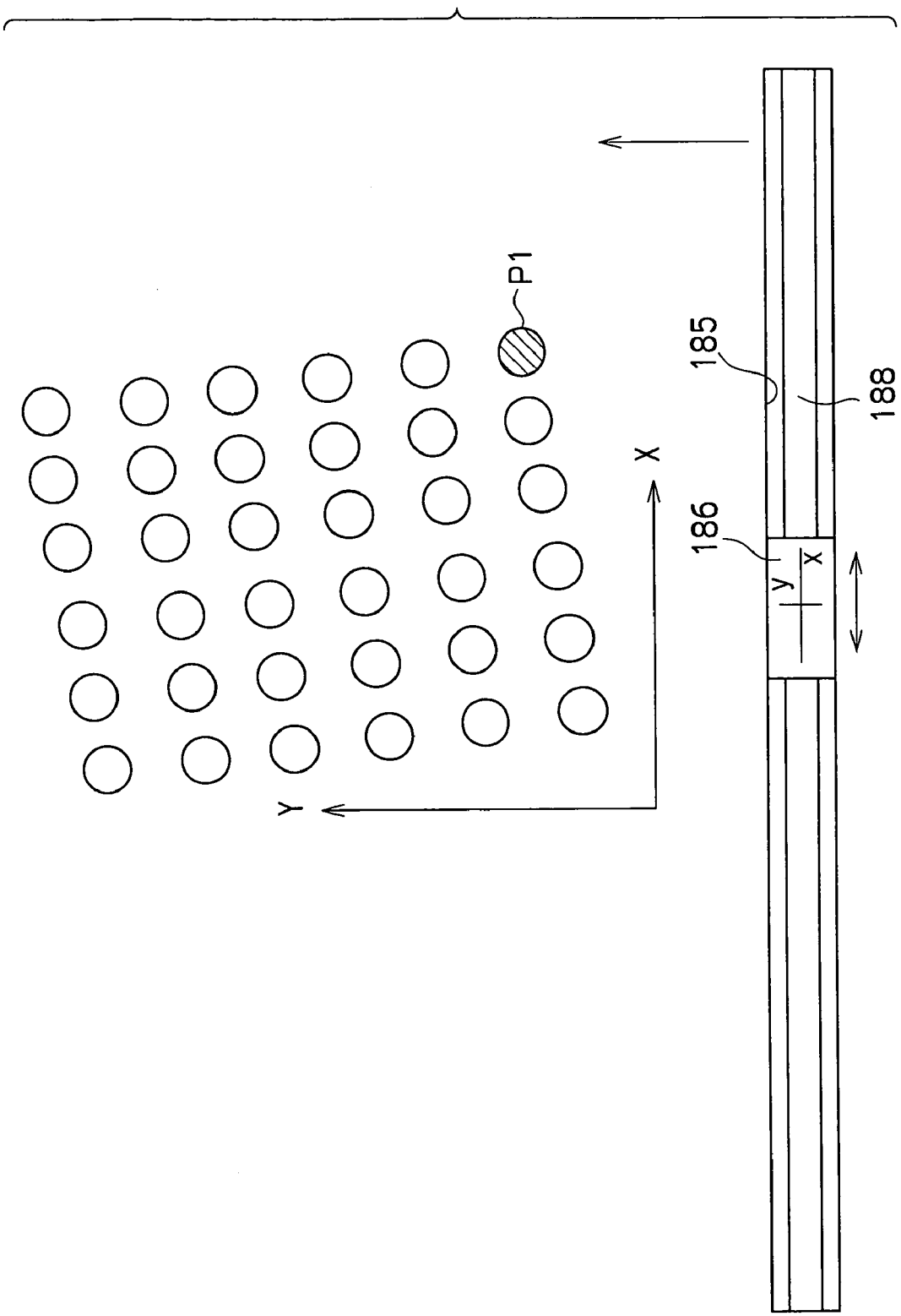
FIG. 14 is a summary plan view showing a process of specifying positions of connecting pixels P1 and P2 at the surface detector of FIG. 13.

Processes for specifying the positions of the connecting pixels in the exposure device relating to Embodiment 3 will be described by using FIG. 14.

First, among the pixels of the exposure head 166A, a pixel for which an attempt is to be made to connect the pixel to the exposure region 168B is selected and is designated as the connecting pixel P1 and is lit. The connecting pixel P1 may be one pixel or two or more pixels.

Next, the surface detector 186 is moved in the X axis direction by the feed devices 187. Simultaneously therewith, the stage 152 is moved such that the surface detector 186 is moved in the Y axis direction. The surface detector 186 is stopped when the exposure beam from the connecting pixel P1 is incident on the origin (0, 0) of the surface detector 186. The position (X1, Y1) of the connecting pixel P1 on the XY plane is determined from the position of the surface detector 186 detected by the linear encoder 188 at this time, and from the position of the stage 152 determined from the amount of movement of the stage 152.

Next, among the pixels of the exposure head 166B, pixels, for which an attempt is to be made to connect the pixels to the exposure region 168A, are selected and all of these pixels are lit. The XY coordinates of these pixels are determined in accordance with the same processes as described with respect to the connecting pixel P1. Then, among these pixels, the pixel whose X coordinate is the closest to the X coordinate X1 of the connecting pixel P1 is set as the connecting pixel P2 (X2, Y2).

When the connecting pixel P1 (X1, Y1) of the exposure region 168A and the connecting pixel P2 (X2, Y2) of the exposure region 168B are determined, the controller 100 sets the exposure timings of the exposure head 166A and the exposure head 166B in accordance with the distance (Y2–Y1) in the Y axis direction between the connecting pixel P1 and the connecting pixel P2 and the conveying speed of the photosensitive material 150 (i.e., the moving speed V of the stage 152), such that the offset between the images of the connecting pixel P1 and the connecting pixel P2 is the minimum. Further, correction such as image data shifting, image rotation, magnification conversion, and the like are carried out as needed at the exposure head 166A and the exposure head 166B. In this way, the image 169A and the image 169B such as shown in FIG. 9 are obtained.

In the exposure head relating to Embodiment 3, the surface detector 186 is moved not only in the Y axis direction, but also in the X axis direction, and the positions of the connecting pixel P1 and the connecting pixel P2 are determined.

Accordingly, even in a case in which the distance in the X axis direction between the connecting pixel P1 and the connecting pixel P2 is large, the actual positions of the connecting pixel P1 and the connecting pixel P2 on the XY plane can be specified. Further, by controlling the image signal inputs of the exposure head 166A and the exposure head 166B on the basis of these actual positions, it is possible to prevent offset and overlapping of the image from occurring between the exposure head 166A and the exposure head 166B.

Next, the detector 180 is moved by the feed devices 187 to the juncture between the exposure head 166B and the exposure head 166C. In accordance with the same processes, the connecting pixels of the image 169B and the image 169C formed by the exposure head 166B and the exposure head 166C, respectively, are specified. By successively repeating these processes, connecting pixels between all of the exposure heads 166 of the exposure device are specified, and the image data inputted to the exposure heads 166 is subjected to correction such as image data shifting, image rotation, magnification conversion, or the like so that the images overlap at the connecting pixels. In this way, it is possible to form an image which has little offset or overlapping at the junctures over the entire exposure region.

In this way, by using the exposure device of Embodiment 3, even if the photosensitive material 150 having a large surface area is exposed by using the large number of exposure heads 166, a continuous, large image can be formed on the photosensitive material 150 without offset, gaps, or overlapping between the exposure regions 168.

Accordingly, even in cases in which the exposure device is applied to the manufacture of large-surface-area printed circuit boards, TFTs, color filters of liquid crystal display devices, and plasma display panels, the production of defective products due to offset between the images of the exposure heads 166 can be prevented particularly effectively.

As described above, the present invention provides an image forming device and a method of correcting image offset which can, in a multi-head exposure device, make the offset between exposure regions exposed by exposure heads be extremely small, and enable formation of a continuous large image.

EMBODIMENT 4

Figure 15:
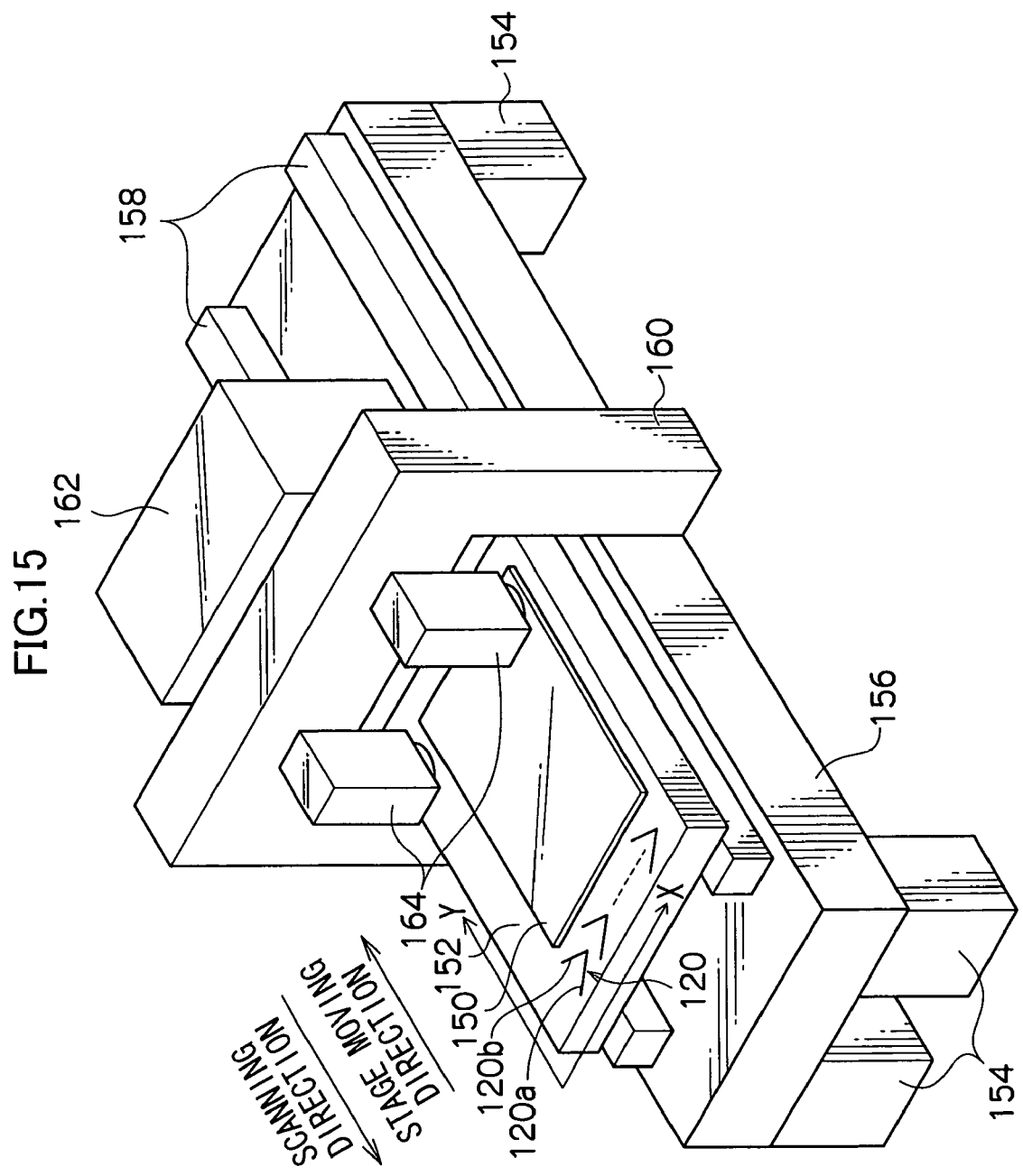
FIG. 15 is a perspective view showing the structure of an exposure device relating to still yet another embodiment of the present invention.

The overall structure of still yet another example of the exposure device encompassed by the image forming device of the present invention is shown in FIG. 15. Note that description of structures which are similar to those of Embodiment 1 is omitted. Further, reference numerals which are the same as in Embodiment 1 as a rule denote the same structural elements.

The exposure device relating to Embodiment 4 is a so-called flatbed-type exposure device similar to the exposure device of Embodiment 1. As shown in FIG. 15, the exposure device has the exposure stage 152 which is shaped as a flat plate, and which attracts and holds the sheet-like photosensitive material 150 to the surface of the exposure stage 152. Note that the controller which controls the scanner 162 and the sensors 164 is not illustrated.

In Embodiment 4, a plurality of slits 120, which are formed in the shapes of arrowheads which open in the X axis direction, are formed in the end portion of the exposure stage 152 at the upstream side along the conveying direction (scanning direction) (hereinafter, this side will, upon occasion, merely be called the "upstream side").

The slit 120 is formed from a slit 120a positioned at the upstream side and a slit 120b positioned at the downstream side. The slit 120a and the slit 120b intersect one another.

The slit 120*a* is angled at 135° with respect to the Y axis, whereas the slit 120*b* is angled at 45° with respect to the Y axis.

A detector (not illustrated) which detects the light from the exposure heads 166 is formed beneath the slits 120.

The slits 120 and the detector move along the Y axis direction together with the exposure stage 152. Note that the slits 120 and the detector correspond to the beam position detecting mechanism in the present invention.

In the present embodiment, the slit 120*a* and the slit 120*b* are formed so as to form an angle of 45° with respect to the scanning direction. However, the angle with respect to the scanning direction is not limited to this angle, provided that the slit 120*a* and the slit 120*b* are inclined with respect to the arrangement of the pixels of the exposure head 166, and at the same time, are inclined with respect to the scanning direction (i.e., the stage moving direction). Further, in place of the slits 120, a diffraction grating may be used.

Figure 16:
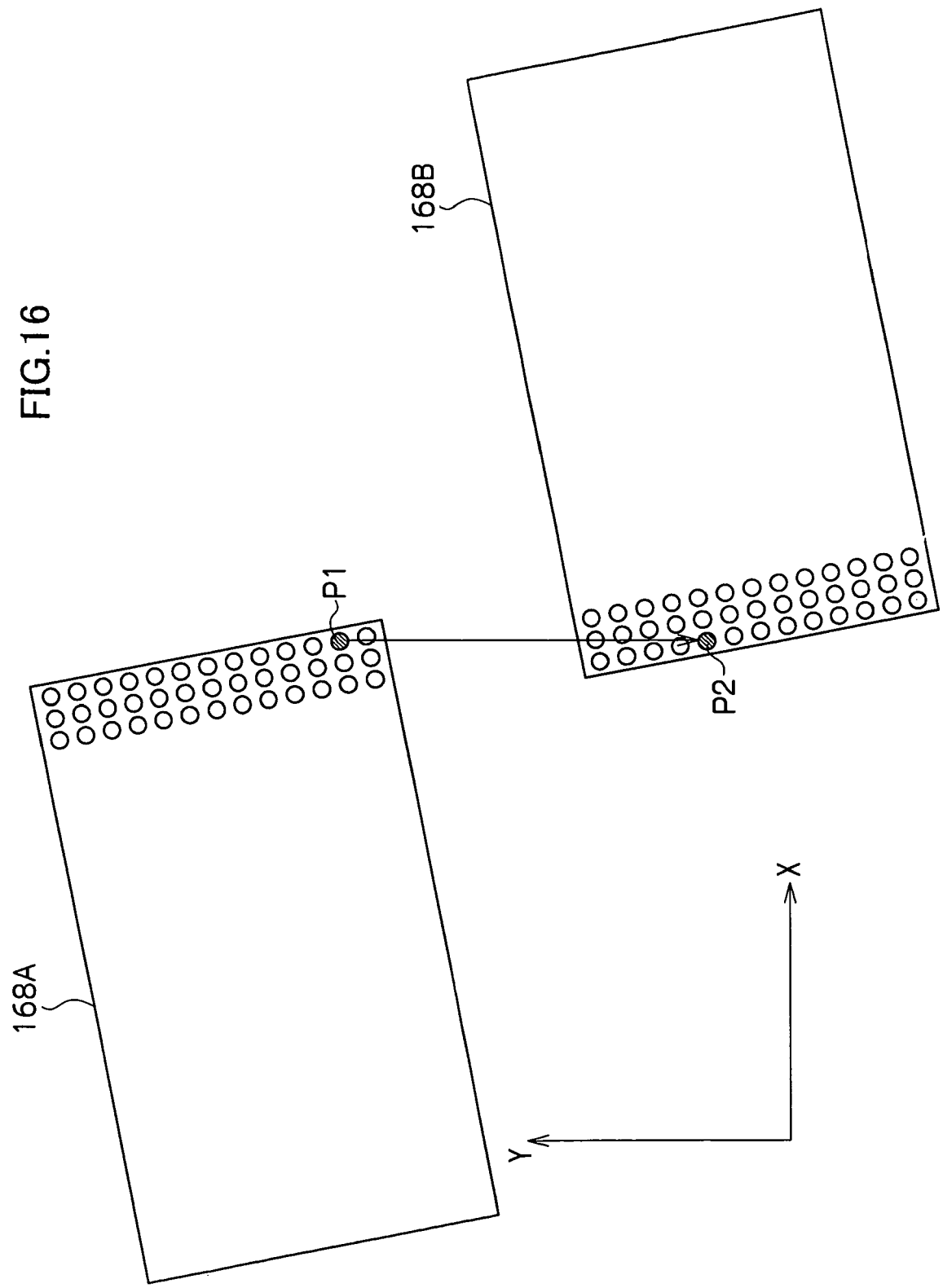
FIG. 16 is a plan view showing, in the exposure device of FIG. 15, the positional relationship between one image region illuminated by one exposure head, and another image region which is illuminated by another exposure head and for which an attempt is to be made to connect this other image region to the one image region.

In the same way as in Example 1, at the scanner 162, the portion, which cannot be exposed, between the left-most exposure region 168A in the first line and the exposure region 168C positioned next to the exposure region 168A at the right side thereof, is exposed by the exposure region 168B which is left-most in the second line. In this way, the image region which is connected to the image region 168A is the image region 168B. FIG. 16 shows the positional relationship between the image region 168A and the image region 168B. In the figures from FIG. 16 on, the scanning direction is the X axis, and the direction in which the exposure heads 166 are lined up is the Y axis.

As shown in FIG. 16, the image region 168A and the image region 168B are connected at the connecting pixel P1, which is a pixel of the exposure head 166A, and the connecting pixel P2, which is a pixel of the exposure head 166B. The connecting pixel P1 and the connecting pixel P2 are examples of the first connecting pixel and the second connecting pixel, respectively, in the present invention.

Hereinafter, the processes for selecting the connecting pixel P1 and the connecting pixel P2 and specifying the actual positions thereof will be described.

First, the exposure stage 152 is moved, and the slits 120 are positioned beneath the scanner 162. Among the pixels of the exposure head 166A, a pixel which should be overlapped on a pixel of the exposure head 166B is selected as the connecting pixel P1 and is lit.

Figure 17:
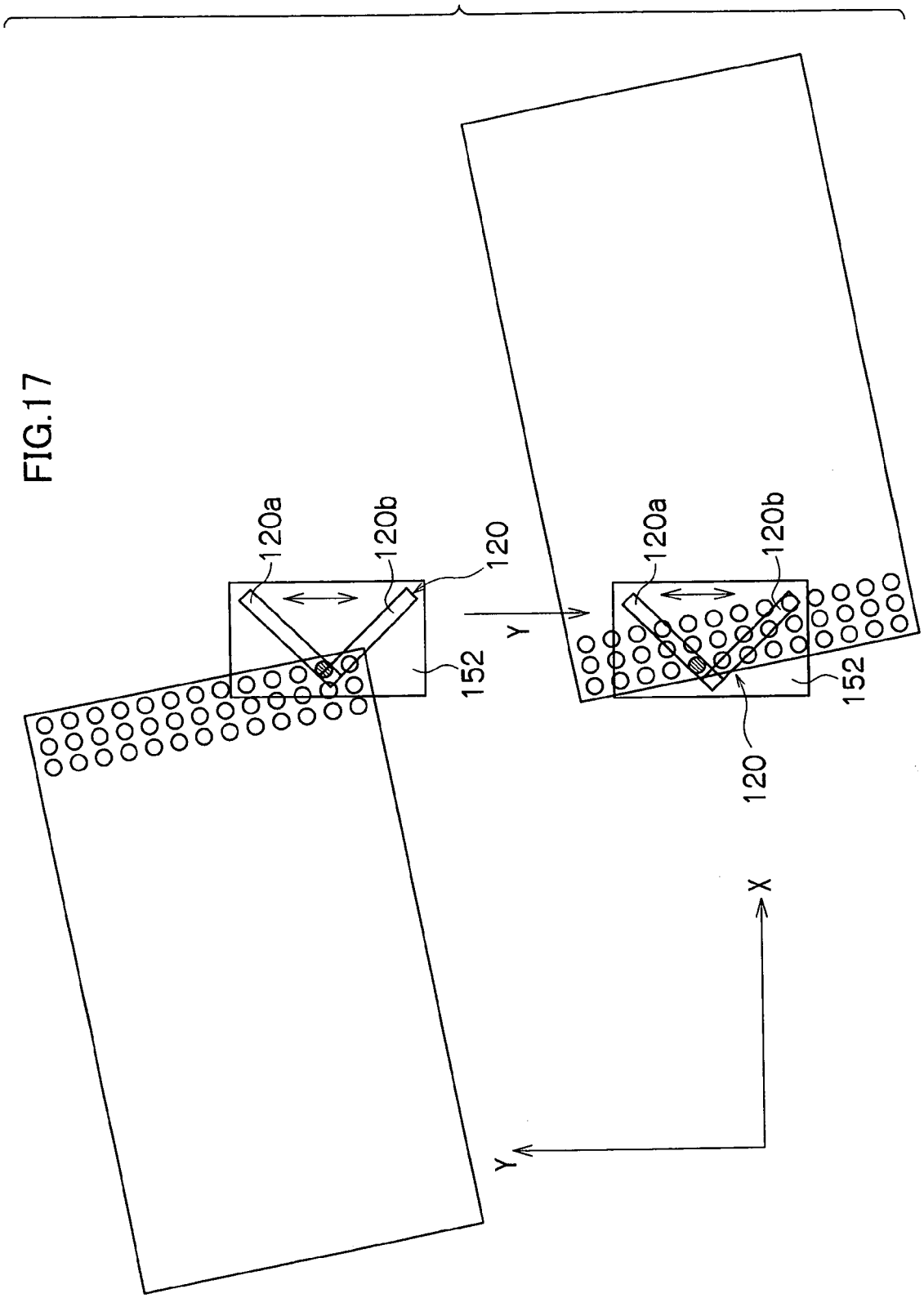
FIG. 17 is a plan view showing the positional relationship between, on the one hand, the one image region and the other image region, and, on the other hand, a slit provided at an exposure stage of the exposure device.
Figure 18:
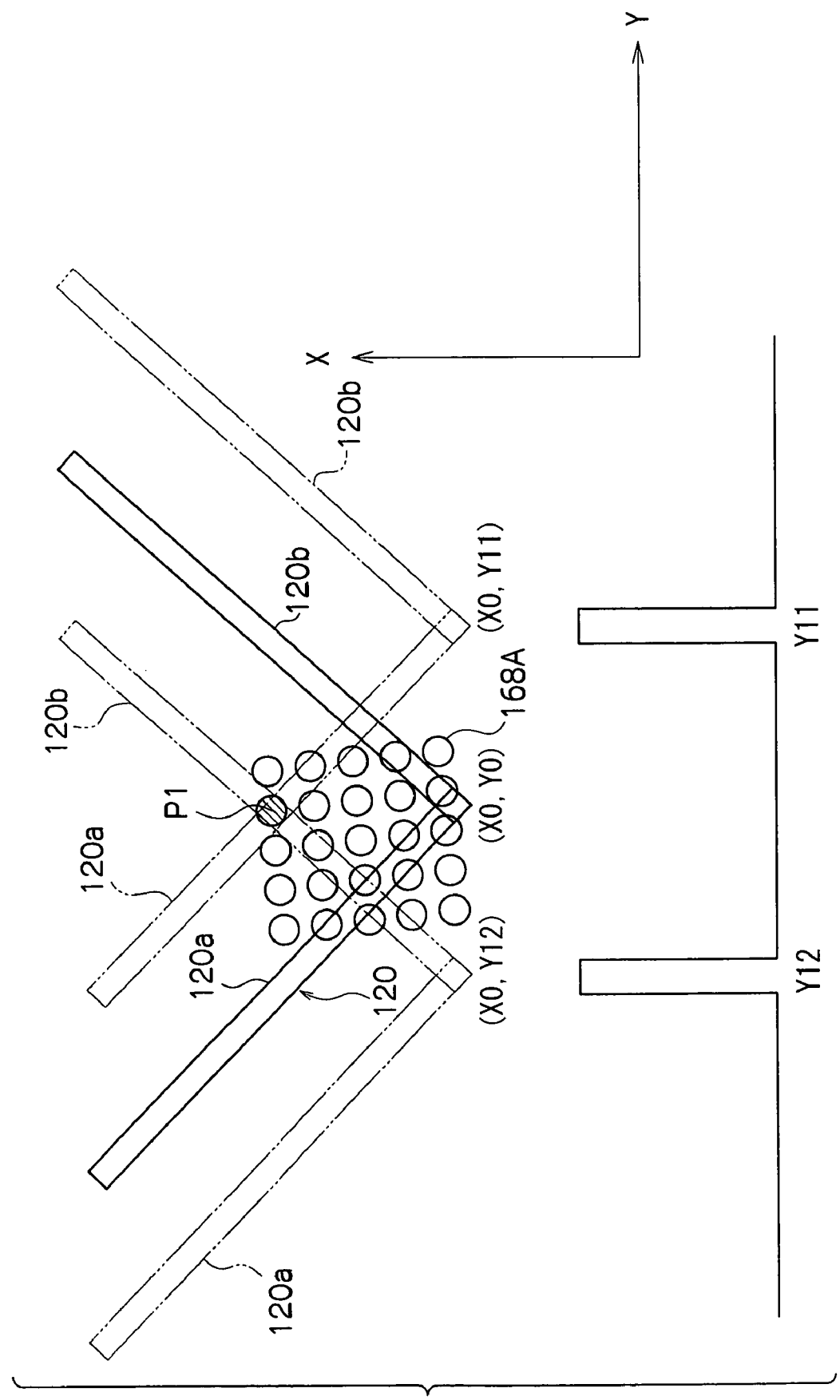
FIG. 18 is an explanatory diagram showing the process of specifying, by the slit, the position of one connecting pixel which is a connecting pixel of the one exposure head.

Next, as shown in FIGS. 17 and 18, the exposure stage 152 is moved slowly such that the slits 120 are moved along the Y axis direction and positioned at the image region 168A. The intersection point of the slit 120*a* and the slit 120*b* at this time is (X0, Y0). Here, as described above, the slit 120*a* forms a 135° angle with respect to the Y axis, and the slit 120*b* forms a 45° angle with respect to the Y axis. Note that, in figures from FIG. 18 on, the direction of rotation in the counterclockwise direction from the Y axis is positive angles.

Next, as shown in FIG. 18, the exposure stage 152 is moved, and the slits 120 are moved toward the right in FIG. 18 along the Y axis. Then, the exposure stage 152 is stopped when the light from the connecting pixel P1 passes through the left-side slit 120*a* and is detected at the detector, as shown by the two-dot chain line in FIG. 18. The intersection point of the slit 120*a* and the slit 120*b* at this time is (X0, Y11).

Next, the exposure stage 152 is moved, and the slits 120 are moved toward the left in FIG. 18 along the Y axis. Then, the exposure stage 152 is stopped when the light from the connecting pixel P1 passes through the right-side slit 120*b* and is detected at the detector, as shown by the two-dot chain line in FIG. 18. The intersection point of the slit 120*a* and the slit 120*b* at this time is (X0, Y12).

Here, given that the coordinate of the connecting pixel P1 is (X1, Y1), X1 is expressed as X1=X0+(Y11−Y12)/2, and Y1 is expressed as Y1=(Y11+Y12)/2.

When the coordinate of the connecting pixel P1 is determined, the connecting pixel P1 is turned off. Among the pixels of the exposure head 166B, the pixel, which is a pixel which should be connected to the image region 168A and which is closest to the position of the connecting pixel P1, is selected as the connecting pixel p2 and is lit.

Then, the exposure stage 152 is moved by Y, and the slits 120 are positioned at the image region 168B. The coordinate of the intersection point of the slit 120*a* and the slit 120*b* at this time is (X0, Y0+Y).

Figure 19:
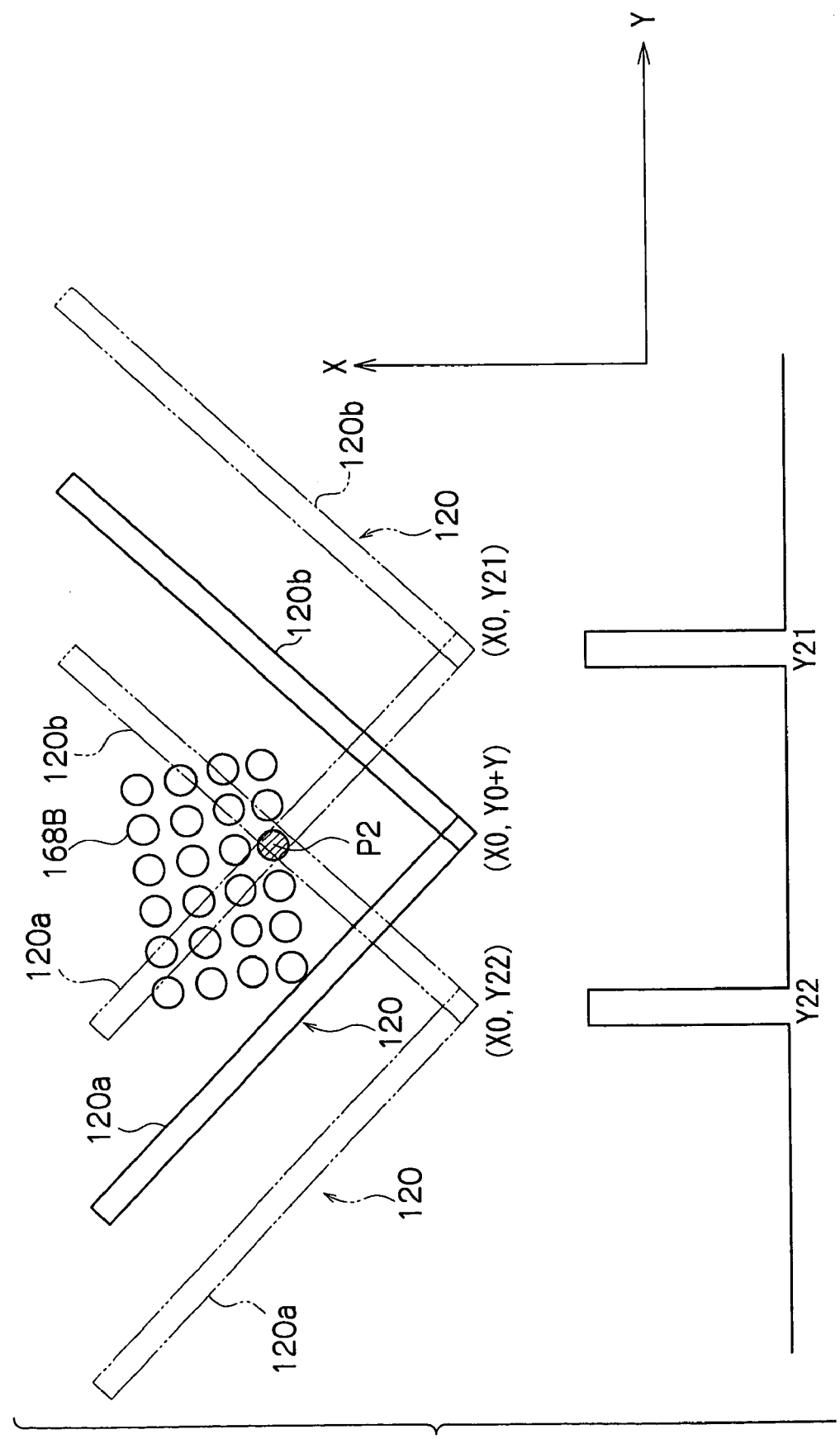
FIG. 19 is an explanatory diagram showing the process of specifying, by the slit, the position of a pixel for which an attempt is to be made to connect this pixel to the one image region, among the pixels of the other exposure head.

Then, as shown in FIG. 19, the exposure stage 152 is moved, and the slits 120 are moved toward the right in FIG. 19 along the Y axis. The exposure stage 152 is stopped when the light from the connecting pixel p2 passes through the left-side slit 120*a* and is detected at the detector, as shown by the two-dot chain line in FIG. 19. The intersection point of the slit 120*a* and the slit 120*b* at this time is (X0, Y21).

Next, the exposure stage 152 is moved, and the slits 120 are moved toward the left in FIG. 19 along the Y axis. Then, the exposure stage 152 is stopped when the light from the connecting pixel p2 passes through the right-side slit 120*b* and is detected at the detector, as shown by the two-dot chain line in FIG. 19. The intersection point of the slit 120*a* and the slit 120*b* at this time is (X0, Y22).

Here, given that the coordinate of the connecting pixel p2 is (x2, y2), x2 is expressed as x2=X0+(Y21−Y22)/2, and y2 is expressed as y2=(Y21+Y22)/2.

Figure 20:
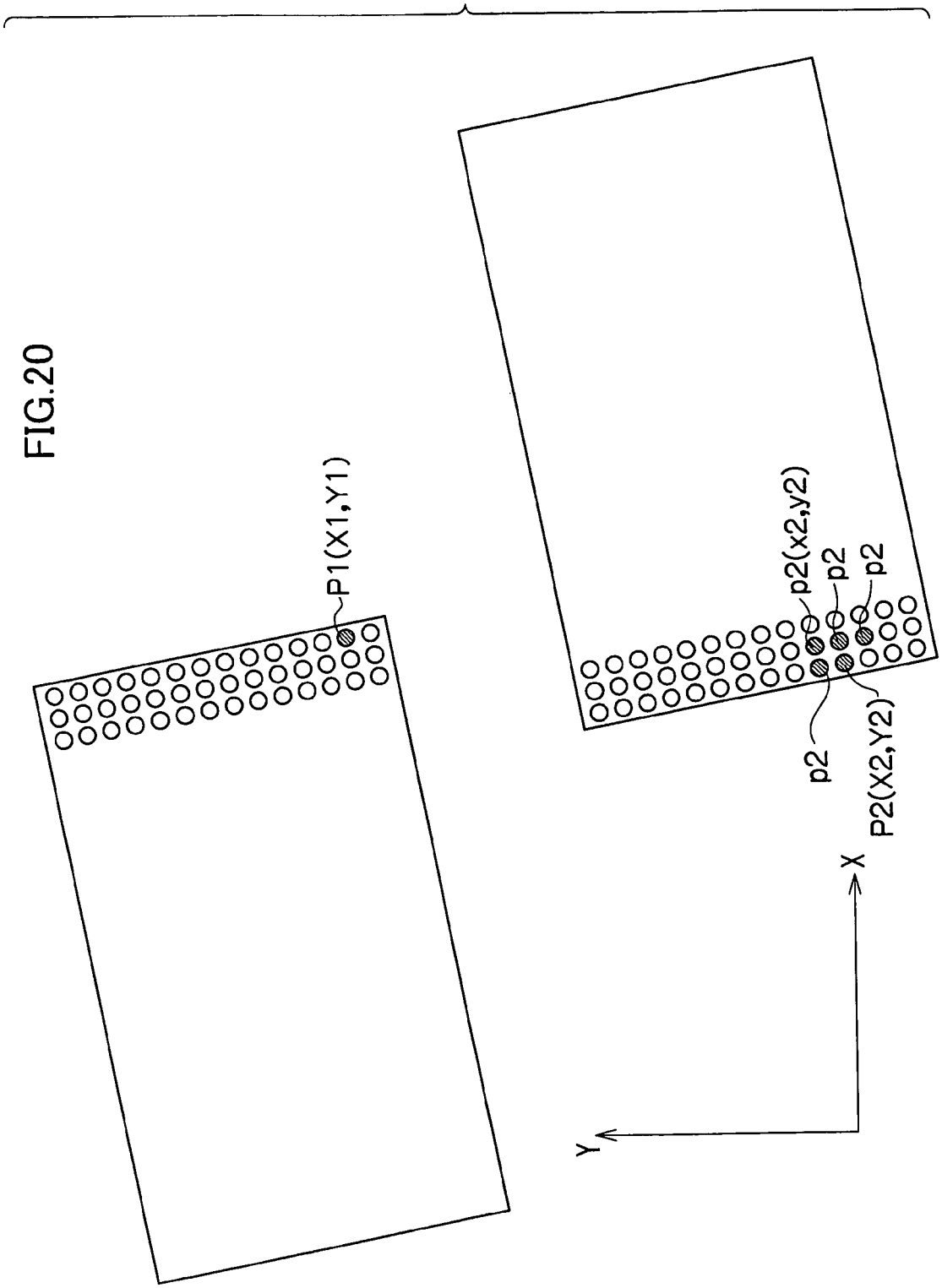
FIG. 20 is an explanatory diagram showing the process of selecting the other connecting pixel, from the pixels whose positions were specified by the process of FIG. 19, among the pixels of the other exposure head.

For the connecting pixel p2 (x2, y2) which is determined in this way, as shown in FIG. 20, the difference ΔX=x2−X1 in the X coordinate of this connecting pixel p2 and the connecting pixel P1 is determined. Then, among the pixels p2, the pixel whose X coordinate difference ΔX is the smallest is selected as the connecting pixel P2 (X2, Y2).

Figure 21:
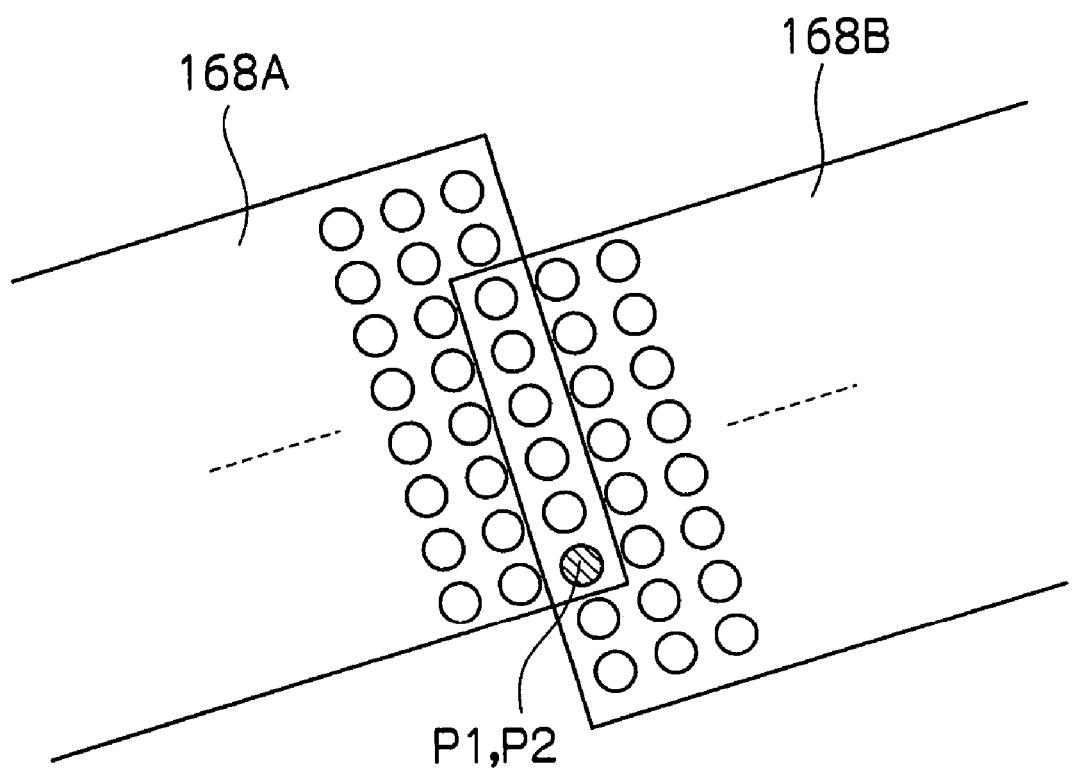
FIG. 21 is a plan view showing a state in which the one image region and the other image region are connected by the one connecting pixel and the other connecting pixel.

The offset in the X axis direction between the connecting pixel P1 and the connecting pixel P2 is extremely small. Accordingly, by correcting the exposure timing, the offset in the Y axis direction is eliminated. With regard to the X axis direction, the image data inputted to the exposure head 166A and the exposure head 166B are controlled so that the images overlap. In this way, as shown in FIG. 21, offset and overlapping between the images of the connecting pixel P1 and the connecting pixel P2 can be eliminated.

Note that offset and overlapping between the images of the exposure head 166A and the exposure head 166B can be made to be even smaller if a plurality of the connecting pixels P1 are designated at the exposure head 166A, and the actual XY coordinates (X1, Y1) are specified for each of the plural connecting pixels P1 in accordance with the above-described processes, and, for each of the connecting pixels P1, the connecting pixel P2 is designated from the pixels of the exposure head 166B and the actual XY coordinates (X2, Y2) thereof are specified.

In the exposure device relating to Embodiment 4, the exposure stage is moved, and the light amounts of the exposure beams passing through the slit 120*a* and the slit 120*b* are detected at the detector. In this way, the connecting pixel P1 and the connecting pixel P2 are selected from the pixels of the exposure head 166A and the exposure head 166B, and their actual positions can be specified.

Accordingly, there is no need for large, expensive, additional equipment to select the connecting pixel P1 and the connecting pixel P2 and specify their positions.

Even in a case in which, for some reason, the relative positional relationship between the exposure head 166A and the exposure head 166B becomes offset, the image data inputted to the exposure head 166A and the exposure head 166B is controlled on the basis of the position information relating to the actual positions of the connecting pixel P1 and the connecting pixel P2. In this way, the offset or overlapping between the images of the exposure head 166A and the exposure head 166B can be corrected accurately.

Hereinabove, a method has been described of forming an image without offset or overlapping, by specifying connecting pixels of the exposure head 166A and the exposure head 166B by using the slit 120a and the slit 120b. By successively repeating the same processes, connecting pixels between all of the exposure heads 166 of the exposure device 100 are specified, and the image data inputted to the exposure heads 166 can be subjected to correction such as image data shifting, image rotation, magnification conversion, or the like so that the images overlap at the connecting pixels. It is possible to form an image which has little offset at the junctures over the entire exposure region.

EMBODIMENT 5

Figure 22:
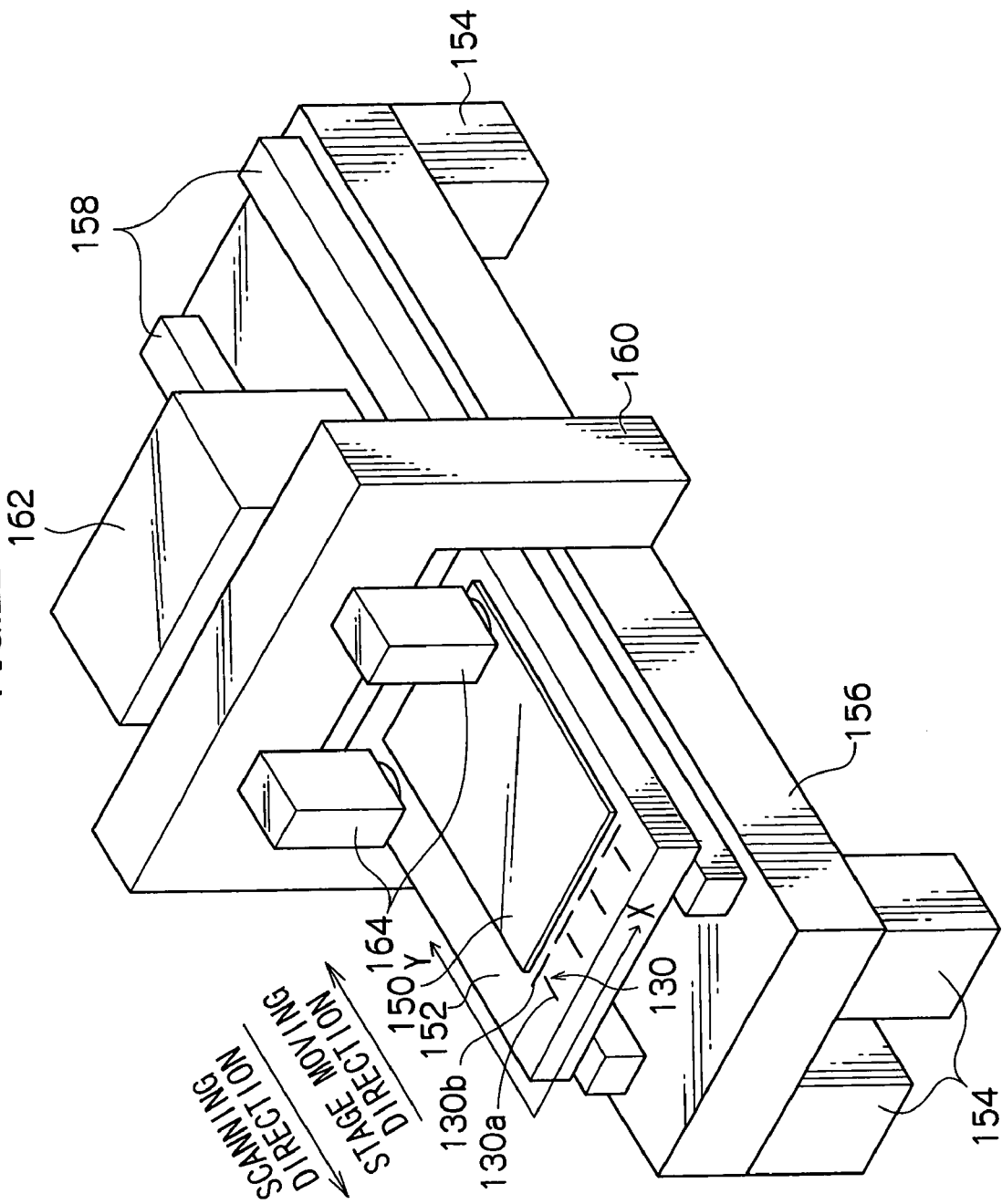
FIG. 22 is a perspective view showing the structure of an exposure device relating to yet another embodiment of the present invention.

The overall structure of yet another example of the exposure device encompassed by the image forming device of the present invention is shown in FIG. 22. Note that description of structures which are similar to those of Embodiment 1 is omitted. Further, reference numerals which are the same as in Embodiment 1 as a rule denote the same structural elements. Moreover, the controller, which controls the scanner 162 and the sensors 164, is not illustrated.

As shown in FIG. 22, slits 130 are provided in the upstream side end portion of the exposure stage 152 of the exposure device relating to Embodiment 5. The slit 130 is formed from a slit 130a which is parallel to the Y axis and a slit 130b which is parallel to the X axis. The slit 130a and the slit 130b are provided in the shape of the letter T. A detector, which detects the exposure beams which pass through the slit 130a and the slit 130b, is provided beneath the slit 130a and the slit 130b.

Hereinafter, processes for selecting the connecting pixel P1 from the pixels of the exposure head 166A and specifying the position thereof in the exposure device relating to Embodiment 5 will be described.

First, the exposure stage 152 is moved such that the slit 130 is positioned in a vicinity of the juncture between the image region 168A and the image region 168B.

Figure 23:
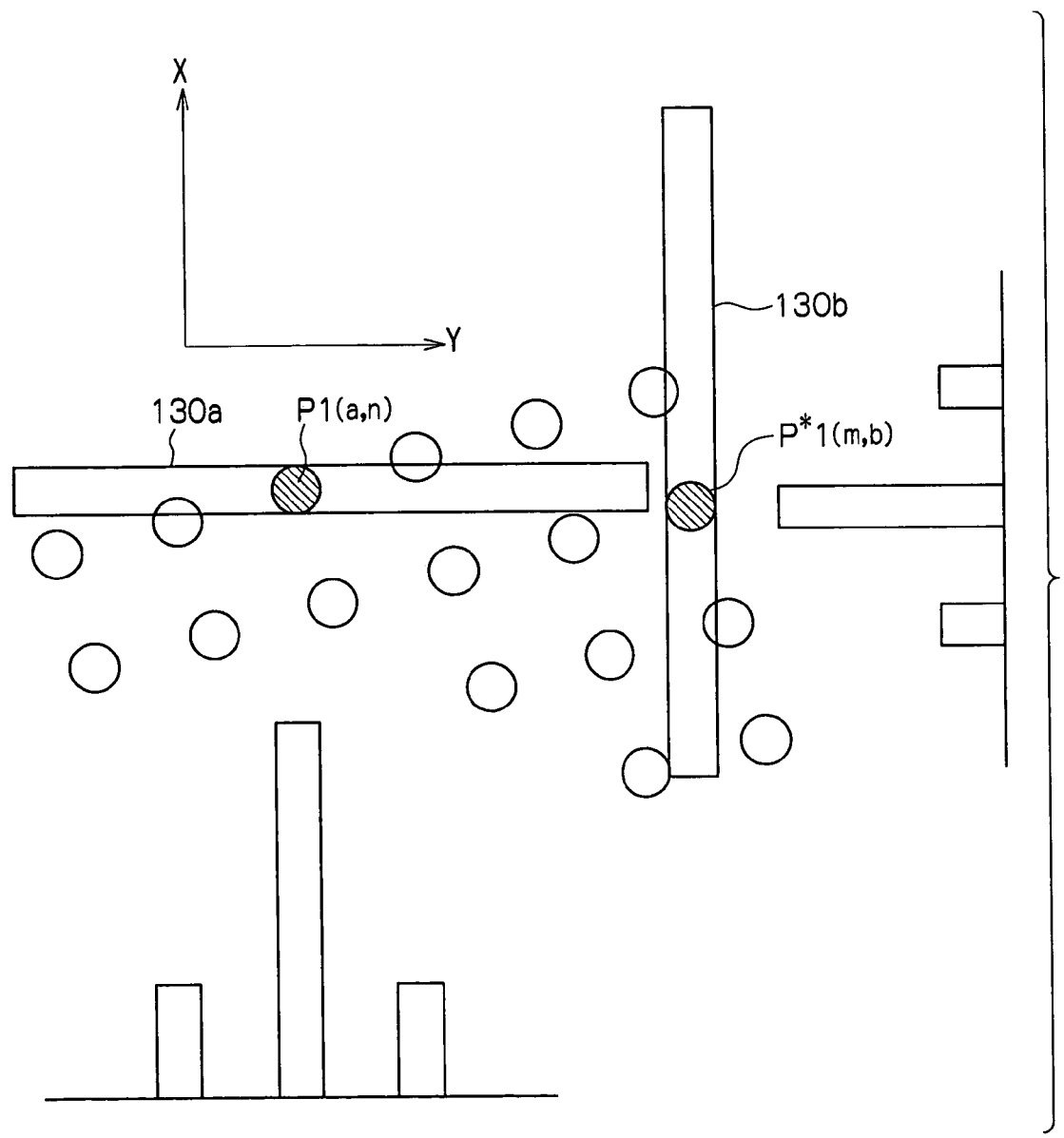
FIG. 23 is an explanatory diagram showing the process of specifying the position of one connecting pixel in one exposure head by a slit provided at an exposure stage, in the exposure device of FIG. 22.

When the slit 130 is positioned beneath the exposure head 166A and the exposure head 166B, the exposure stage 152 is stopped at that position. Then, as shown in FIG. 23, the pixels are successively lit along the direction of a given line of the exposure head 166A (the transverse direction). Similarly, the pixels are successively lit from bottom to top along the direction of a given column of the exposure head 166A (the lengthwise direction).

As shown in FIG. 23, at the time when the detector of the slit 130a detects the peak of the light amount when the pixel P1 (a, n) is lit, and the detector of the slit 130b detects the peak of the light amount when the pixel P*1 (m, b) is lit, the pixel P1 of the exposure head 166A is selected as the connecting pixel P1 and the pixel P*1 is selected as an auxiliary pixel. Note that the (a, n) and (m, b) of the connecting pixel P1 (a, n) and the auxiliary pixel P*1 (m, b) are the X coordinate and the Y coordinate of each of the connecting pixel P1 and the auxiliary pixel P*1.

Figure 24:
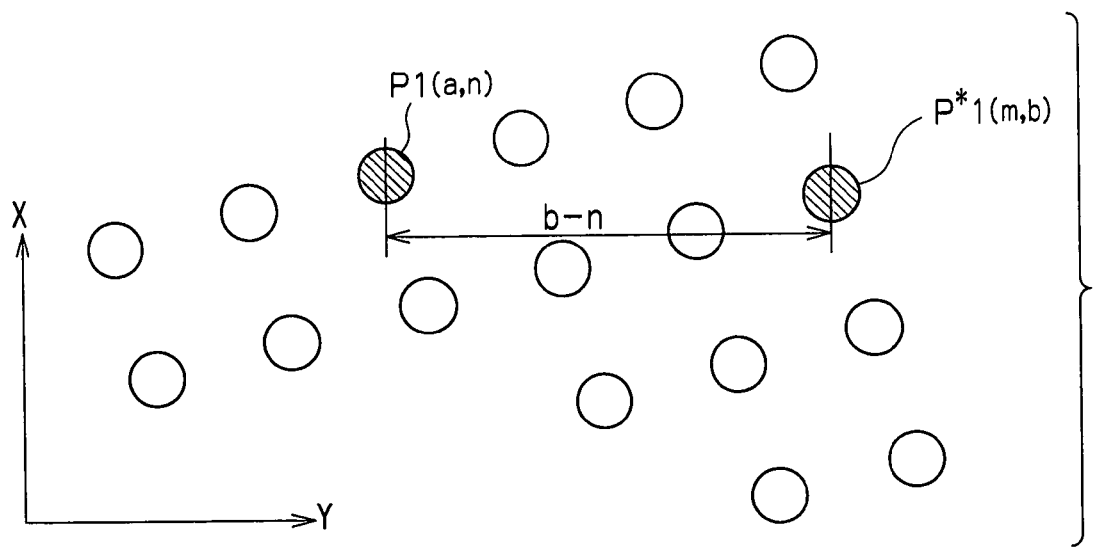
FIG. 24 is an explanatory diagram showing a difference in positions, along the Y axis direction, between a connecting pixel P1 and an auxiliary pixel P*1.

Here, as shown in FIG. 24, the positional difference $\Delta Y1$ in the Y axis direction between the connecting pixel P1 (a, n) and the auxiliary pixel P*1 (m, b) is given by the following formula:

$$\Delta Y1 = b - n$$

Next, the exposure stage 152 is moved by a distance Ys, and the pixels of a given line of the exposure head 166B are successively lit from the left to the right, and similarly, the pixels of a given column are successively lit from bottom to top along the X axis direction.

At this time, given that the detector of the slit 130a detects the peak of the light amount when the pixel P2 (c, n') is lit, and that the detector of the slit 130b detects the peak of the light amount when the pixel P*2 (m', d) is lit, the pixel P2 (c, n') is selected as the connecting pixel, and the pixel P*2 is selected as the auxiliary pixel.

The positional difference $\Delta Y2$ in the Y axis direction between the connecting pixel P2 (c, n') and the auxiliary pixel P*2 (m', b) is given by the following formula:

$$\Delta Y2 = (d - n')$$

At the time when the connecting pixel P1 (a, n) is detected and at the time when the connecting pixel P2 (c, n') is detected, the slit 130 does not move at all in the X axis direction. Therefore, the X coordinates of the connecting pixel P1 (a, n) and the connecting pixel P2 (c, n') coincide. On the other hand, the distance in the Y axis direction is given by the following formula:

$$Ys + \Delta Y2 - \Delta Y1 = Ys + d - n' - (b - n)$$

Accordingly, by correcting the lighting timings in accordance with the Y axis direction distance between the connecting pixel P1 (a, n) and the connecting pixel P2 (c, n'), offset or overlapping between the exposure head 166A and the exposure head 166B can be eliminated.

Figure 25:
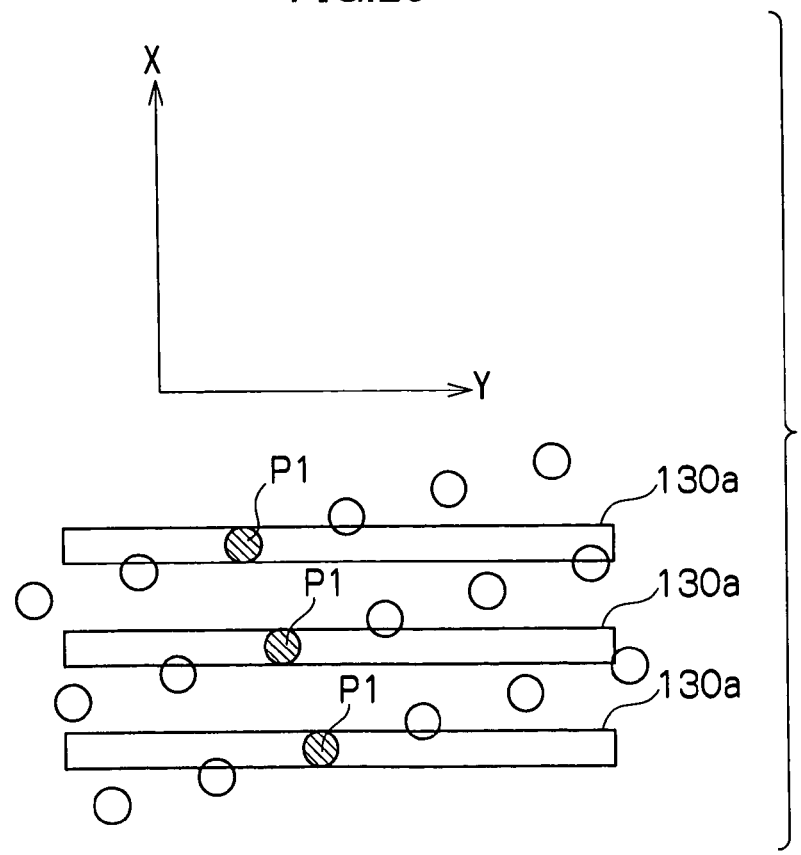
FIG. 25 is an explanatory diagram showing the process of specifying positions of connecting pixels by using a plurality of slits which are parallel to one another, in the exposure device of FIG. 22.

Hereinabove, description has been given of an example in which the connecting pixel P1 (a, n) and the connecting pixel P2 (c, n') are selected by using one slit 130a and one slit 130b, and the positions are specified. Note that, as shown in FIG. 25, the amount of light transmitted through is increased if a plurality of the slits 130a and the slits 130b are provided in accordance with the pitches, along the X axis direction and the Y axis direction, of the pixels of the exposure head 166A and the exposure head 166B. In this way, the accuracy of detecting the pixels improves, and pixel connection of an even higher accuracy is possible.

In the exposure device relating to Embodiment 5, the X coordinate of the connecting pixel P2 is the same as that of the connecting pixel P1. Accordingly, if image data input is controlled such that the same image data for the X axis direction is inputted to the exposure head 166A and the exposure head 166B, offset between the images of the exposure head 166A and the exposure head 166B can be eliminated completely. Further, the image offset in the Y axis direction as well can be eliminated by adjusting the lighting timings between the connecting pixel P1 and the connecting pixel P2.

Accordingly, even more accurate pixel connection than in the exposure device relating to Embodiment 4 is possible.

Moreover, the exposure stage 152 is stopped while the connecting pixel P1 and the connecting pixel P2 are being selected. Therefore, as compared with the exposure device relating to Embodiment 4, the frequency of moving the exposure table 152 at the time of selecting the connecting pixels and at the time of specifying the positions thereof can be reduced even more.

A method has been described above in which an image without offset or overlapping is formed by specifying connecting pixels of the exposure head 166A and the exposure head 166B by using the slit 130a and the slit 130b. By successively repeating the same processes, connecting pixels between all of the exposure heads 166 of the exposure device are specified, and the image data inputted to the exposure heads 166 can be subjected to correction such as image data shifting, image rotation, magnification conversion, or the like so that the images overlap at the connecting pixels. It is possible to form an image which has little offset at the junctures over the entire exposure region.

EMBODIMENT 6

Figure 26:
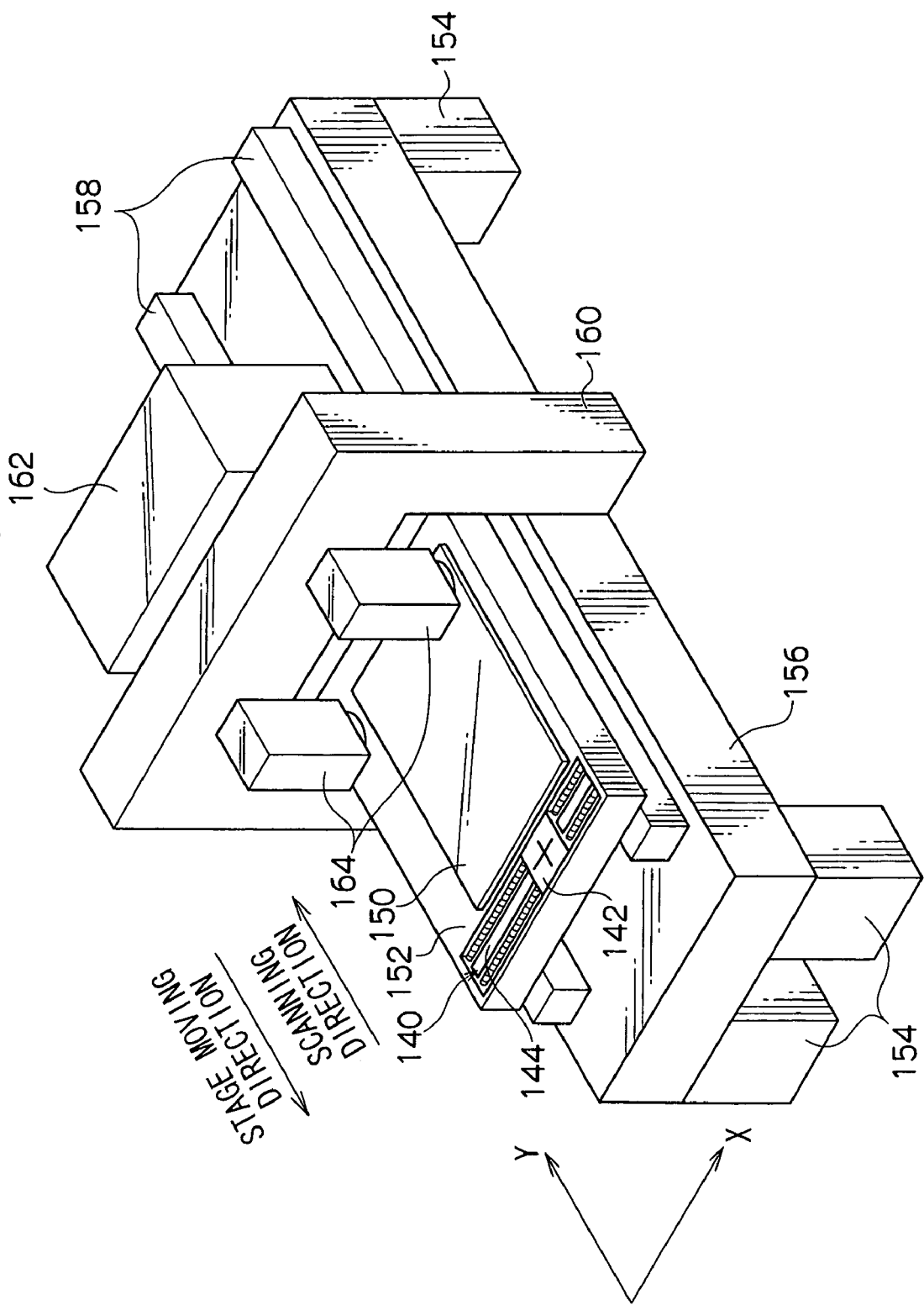
FIG. 26 is a perspective view showing the structure of an exposure device relating to still yet another embodiment of the present invention.

The overall structure of still yet another example of the exposure device encompassed by the image forming device of the present invention is shown in FIG. 26. Note that description of structures which are similar to those of Embodiment 1 is omitted. Further, reference numerals which are the same as in Embodiment 1 as a rule denote the same structural elements. Moreover, the controller, which controls the scanner 162 and the sensors 164, is not illustrated.

As shown in FIG. 26, in an exposure device relating to Embodiment 6, a beam position detecting device 140, which corresponds to the beam position detecting mechanism of the present invention, is provided at the upstream side end portion of the exposure stage 152.

Details of the beam position detecting device 140 are shown in FIG. 27.

As shown in FIGS. 26 and 27, the beam position detecting device 140 is provided with a base 142 which slides within a groove 148 provided along the X axis direction at the upstream side end portion of the exposure stage 152; a linear encoder 144 which is provided at the central portion of the groove 148 along the moving direction of the base 142 and which detects the X axis direction position of the base 142; and a pair of ball screws 146 which move the base 142 within the groove 148. Two linear guides (not illustrated) which are parallel to one another are provided at the base 142. Note that the ball screws 146 are rotated by a motor (not illustrated), and move the base 142.

The top surface of the base 142 is formed so as to be positioned in the same plane as the exposure surface of the exposure stage 152. A slit 140a along the X axis direction and a slit 140b along the Y axis direction are provided in the top surface of the base 142. The slit 140a and the slit 140b are perpendicular to one another. A detector (not illustrated), which detects the light of the exposure beam passing through the slit 140a and the slit 140b, is provided beneath the slit 140a and the slit 140b.

A connecting pixel P1 and a connecting pixel P2 are selected from the pixels of the exposure head 166A and the exposure head 166B at the exposure device, and the actual positions thereof are specified.

First, the exposure stage 152 is moved, and the beam position detecting device 140 is moved along the Y axis direction. Further, the base 142 of the beam position detecting device 140 is moved along the groove 148, and is positioned at the juncture portion between the image region 168A and the image region 168B.

Next, among the pixels of the exposure head 166A, a pixel for which an attempt is to be made to connect this pixel to the image region 168B is selected, and is set as the connecting pixel P1.

Then, as shown in FIG. 28, the exposure stage 152 is moved slightly, and the base 142 is moved along the Y axis direction. When the amount of light of the exposure beam from the connecting pixel P1 which has passed through the slit 140a reaches a peak, the exposure stage 152 is stopped, and the Y axis direction position of the exposure stage 152 is detected by the linear encoder 144 provided at the exposure stage 152. Then, this Y axis direction position is set to be the Y coordinate Y1 of the connecting pixel P1.

Next, the base 142 is moved in the X axis direction by the ball screws 146. When the amount of light of the exposure beam which has passed through the slit 140b reaches a peak, the X axis direction position of the base 142 at this time is detected by the linear encoder 144. Then, this X axis direction position is set to be the X coordinate X1 of the connecting pixel P1.

When the position of the connecting pixel P1 is specified, the connecting pixel P1 is turned off, and instead, among the pixels of the exposure head 166B, the pixel p2 for which an attempt is to be made to connect this pixel to the image region 168A is lit. The XY coordinates (x2, y2) of the pixel p2 are determined by the beam position detecting device 140 in accordance with the same processes.

The XY coordinates (x2, y2) of the pixels p2 whose coordinates have been determined are compared with the XY coordinates (X1, Y1) of the connecting pixel P1. The pixel p2 which is closest to the connecting pixel P1 is selected as the connecting pixel P2 (X2, Y2).

When the actual positions of the connecting pixel P1 and the connecting pixel P2 are specified in this way, the image data inputted to the exposure head 166A and the exposure head 166B is controlled on the basis of these positions, and the images are connected at the connecting pixel P1 and the connecting pixel P2.

In accordance with the exposure device relating to Embodiment 6, the accurate XY coordinates of the connecting pixel P1 and the connecting pixel P2 are determined in a short time by the beam position detecting device 140. In this way, even in a case in which pixels whose X coordinates are not necessarily the same are selected as the connecting pixel P1 and the connecting pixel P2, the images can be connected accurately.

A method has been described above in which an image without offset or overlapping is formed by specifying connecting pixels of the exposure head 166A and the exposure head 166B by using the beam position detecting device 140. By successively repeating the same processes, connecting pixels between all of the exposure heads 166 of the exposure device 100 are specified, and the image data inputted to the exposure heads 166 can be subjected to correction such as image data shifting, image rotation, magnification conversion, or the like so that the images overlap at the connecting pixels. It is possible to form an image which has little offset at the junctures over the entire exposure region.

As described above, the present invention provides, in a multi-head exposure device, an exposure device in which offset between images formed by respective exposure heads is extremely small, and a method of correcting image offset which can be carried out in this exposure device.

What is claimed is:

1. A pixel position specifying method in an image forming device which forms an image by scanning, in a given direction, a plurality of exposure heads which can selectively turn a plurality of pixels on and off, the method measuring positions of exposure beams of the respective exposure heads and specifying pixel positions of junctures of the exposure heads, the method comprising:

measuring a position of an exposure beam by using a beam position detecting mechanism which is formed so as to be movable on a reference surface along a Y axis direction which is parallel to a scanning direction of the exposure device, and which has at least one pair of slit portions, which are disposed so as to be inclined relative to arrangements of pixels of the exposure heads, and a light amount measuring mechanism, which measures light amounts of exposure beams which pass through the slit portions;

specifying a position of a first connecting pixel on the basis of a position of the beam position detecting mechanism and positions of the slit portions and an angle formed by the slit portions, at a time when the first connecting pixel in a vicinity of a juncture of an image at a first exposure head is turned on and the beam position detecting mechanism is moved along the Y axis direction and light amounts of exposure beams passing through one slit portion and another slit portion reach peaks; and specifying a position of a second connecting pixel on the basis of a position of the beam position detecting mechanism and the angle formed by the slit portions, at a time when the second connecting pixel in a vicinity of a juncture of an image at a second exposure head is turned on and the beam position detecting mechanism is moved along the Y axis direction and light amounts of exposure beams passing through the one slit portion and the other slit portion reach peaks.

2. A method of correcting image offset in an image forming device which forms an image by scanning, in a given direction, a plurality of exposure heads which can selectively turn a plurality of pixels on and off, the method correcting offset and overlapping between images of the respective exposure heads, the method comprising:

specifying positions of a first connecting pixel in a vicinity of a juncture of an image at a first exposure head and a second connecting pixel in a vicinity of a juncture of an image at a second exposure head, by the pixel position specifying method of claim 1; and on the basis of the positions of the first connecting pixel and the second connecting pixel whose pixel positions have been specified, correcting image data inputted to the first exposure head and the second exposure head so that images are connected at the first connecting pixel and the second connecting pixel.

3. The method of correcting image offset of claim 2, wherein, in the image data correcting step, Y axis direction offset between images of the first connecting pixel and the second connecting pixel is eliminated by setting exposure timings of the first exposure head and the second exposure head in accordance with a Y axis direction distance between the first connecting pixel and the second connecting pixel and a scanning speed of the exposure heads, and X axis direction offset between images of the first connecting pixel and the second connecting pixel is eliminated by inputting image data to the first exposure head and the second exposure head so that image data overlap at the first connecting pixel and the second connecting pixel.

4. The method of correcting image offset of claim 2, wherein, also for three or more exposure heads, positions, on the reference surface, of connecting pixels at respective image heads are specified by the pixel position specifying, and the image data inputted to the respective exposure heads is corrected on the basis of the positions of the connecting pixels specified by the pixel position specifying, so that images are connected at the connecting pixels.

5. The method of claim 1, wherein the first connecting pixel is formed by the exposure beam from the first exposure head and wherein the second connecting pixel is formed by the exposure beam from the second exposure head and wherein the first and second exposure heads are adjacent to each other.

6. The method of claim 1, wherein the position of the second connecting pixel is further specified from a difference in Y coordinates of the first and second connecting pixels.

7. The method of claim 1, wherein an image formed by the first exposure head overlaps with an image formed by the second exposure head at the first and second connecting pixels.

8. The method of claim 1, further comprising positioning an image of the second exposure head based on the specified position of the first connecting pixel formed by the first exposure head and the second connecting pixel formed by the second exposure head.

9. The method of claim 1, further comprising: correcting image data input to the first exposure head and the second exposure head, wherein, the image data correcting comprises: eliminating Y axis direction offset between images of the first connecting pixel and the second connecting pixel by setting exposure timings of the first exposure head and the second exposure head in accordance with a Y axis direction distance between the first connecting pixel and the second connecting pixel and a scanning speed of the exposure heads.

10. The method of claim 1, further comprising: correcting image data input to the first exposure head and the second exposure head, wherein, the image data correcting comprises: eliminating X axis direction offset between images of the first connecting pixel and the second connecting pixel by inputting image data to the first exposure head and the second exposure head so that image data overlap at the first connecting pixel and the second connecting pixel.

11. A pixel position specifying method in an image forming device which forms an image by scanning, in a given direction, a plurality of exposure heads which can selectively turn a plurality of pixels on and off, the method measuring positions of exposure beams of the respective exposure heads and specifying pixel positions of junctures of the exposure heads, the method comprising:

measuring a position of an exposure beam by using a beam position detecting mechanism which is provided so as to be movable on a reference surface along a Y axis direction with relation to the exposure heads and has at least one pair of slit portions, which are inclined relative to arrangements of pixels of the exposure heads and one of which is disposed along the Y axis direction which is parallel to a scanning direction of the exposure device and another of which is disposed along an X axis direction which is perpendicular to the Y axis direction, and a light amount measuring mechanism which measures light amounts of exposure beams which pass through the slit portions;

specifying a position of a first connecting pixel from a pixel position at a time when pixels in a vicinity of a juncture of an image at a first exposure head are successively turned on and a light amount of an exposure beam passing through the one slit portion at the beam position detecting mechanism reaches a peak, and from a pixel position at a time when a light amount of an exposure beam passing through the other slit portion at the beam position detecting mechanism reaches a peak, and from a difference in Y coordinates of the two pixels; and specifying a position of a second connecting pixel from a pixel position at a time when pixels in a vicinity of a juncture of an image at a second exposure head are successively turned on and a light amount of an exposure beam passing through the one slit portion at the beam position detecting mechanism reaches a peak, and from a pixel position at a time when a light amount of an exposure beam passing through the other slit portion at the beam position detecting mechanism reaches a peak, and from a difference in Y coordinates of the two pixels.

12. The method of claim 11, wherein the first connecting pixel is formed by the exposure beam from the first exposure head and wherein the second connecting pixel is formed by the exposure beam from the second exposure head and wherein the first and second exposure heads are adjacent to each other.

13. The method of claim 11, wherein an image formed by the first exposure head overlaps with an image formed by the second exposure head at the first and second connecting pixels.

14. The method of claim 11, further comprising positioning an image of the second exposure head based on the specified position of the first connecting pixel formed by the first exposure head and the second connecting pixel formed by the second exposure head.

15. The method of claim 11, further comprising: correcting image data input to the first exposure head and the second exposure head, wherein, the image data correcting comprises: eliminating Y axis direction offset between images of the first connecting pixel and the second connecting pixel by setting exposure timings of the first exposure head and the second exposure head in accordance with a Y axis direction distance between the first connecting pixel and the second connecting pixel and a scanning speed of the exposure heads.

16. The method of claim 11, flirt her comprising: correcting image data input to the first exposure head and the second exposure head, wherein, the image data correcting comprises: eliminating X axis direction offset between images of the first connecting pixel and the second connecting pixel by inputting image data to the first exposure head and the second exposure head so that image data overlap at the first connecting pixel and the second connecting pixel.

17. The pixel position specifying method according to claim 11, wherein the measuring of the position of the exposure beam comprises one of:
measuring the position of the exposure beam by moving the beam position detecting mechanism in the Y axis direction and fixing the exposure heads at a predetermined position, and
measuring the position of the exposure beam by moving the exposure heads in the Y axis direction and fixing the beam position detecting mechanism at a predetermined position.

18. A pixel position specifying method in an image forming device which forms an image by scanning, in a given direction, a plurality of exposure heads which can selectively turn a plurality of pixels on and off, the method measuring positions of exposure beams of the respective exposure heads and specifying pixel positions of junctures of the exposure heads, the method comprising:
measuring a position of an exposure beam by using a beam position detecting mechanism which is formed so as to be movable on a reference surface along a Y axis direction and an X axis direction, and which has a first slit portion which is long in the Y axis direction, a second slit portion which is long in the X axis direction, and a light amount measuring mechanism which measures light amounts of exposure beams passing through the first and second slit portions;
specifying a position of a first connecting pixel on the basis of a position of the beam position detecting mechanism, at a time when the first connecting pixel in a vicinity of a juncture of an image at a first exposure head is turned on and the beam position detecting mechanism is moved in the X axis direction and the Y axis direction and the light amounts of the exposure beams passing through the first slit portion and the second slit portion reach peaks; and
specifying a position of a second connecting pixel on the basis of a position of the beam position detecting mechanism, at a time when the second connecting pixel in a vicinity of a juncture of an image at a second exposure head is turned on and the beam position detecting mechanism is moved in the X axis direction and the Y axis direction and the light amounts of the exposure beams passing through the first slit portion and the second slit portion reach peaks.

19. The method of claim 18, wherein the first connecting pixel is formed by the exposure beam from the first exposure head and wherein the second connecting pixel is formed by the exposure beam from the second exposure head and wherein the first and second exposure heads are adjacent to each other.

20. The method of claim 18, wherein the position of the second connecting pixel is farther specified from a difference in Y coordinates of the first and second connecting pixels.

21. The method of claim 18, wherein an image formed by the first exposure head overlaps with an image formed by the second exposure head at the first and second connecting pixels.

22. The method of claim 18, further comprising positioning an image of the second exposure head based on the specified position of the first connecting pixel formed by the first exposure head and the second connecting pixel formed by the second exposure head.

23. The method of claim 18, further comprising: correcting image data input to the first exposure head and the second exposure head, wherein, the image data correcting comprises: eliminating Y axis direction offset between images of the first connecting pixel and the second connecting pixel by setting exposure timings of the first exposure head and the second exposure head in accordance with a Y axis direction distance between the first connecting pixel and the second connecting pixel and a scanning speed of the exposure heads.

24. The method of claim 18, further comprising: correcting image data input to the first exposure head and the second exposure head, wherein, the image data correcting comprises: eliminating X axis direction offset between images of the first connecting pixel and the second connecting pixel by inputting image data to the first exposure head and the second exposure head so that image data overlap at the first connecting pixel and the second connecting pixel.

25. An image forming device comprising:
an exposure mechanism having a plurality of exposure heads which have a mechanism selectively turning a plurality of pixels on and off, and which form an image by exposing while scanning an image forming surface in a given direction;
a beam position detecting mechanism detecting positions of exposure beams of the respective exposure heads, the beam position detecting mechanism having at least one pair of slit portions, which are formed so as to be movable on a reference surface along a Y axis direction which is parallel to the scanning direction and which are inclined relative to pixel arrangements of the exposure heads, and a light amount measuring mechanism which measures light amounts of exposure beams passing through the slit portions;
a pixel position specifying mechanism specifying positions of pixels of the exposure heads on the basis of positions of exposure beams detected by the beam position detecting mechanism; and
an exposure control mechanism controlling the exposure heads on the basis of the pixel positions specified at the pixel position specifying mechanism,
wherein the pixel position specifying mechanism
specifies a position of a first connecting pixel on the basis of a position of the beam position detecting mechanism and an angle formed by the slit portions, at a time when the first connecting pixel in a vicinity of a juncture of an image at a first exposure head at the exposure mechanism is turned on and the beam position detecting mechanism is moved along the Y axis direction and light amounts of the exposure beams passing through one slit port ion and another slit portion provided at the beam position detecting mechanism reach peaks, and
specifies a position of a second connecting pixel on the basis of a position of the beam position detecting mechanism and an angle formed by the slit portions, at a time when the second connecting pixel in a vicinity of a juncture of an image at a second exposure head at the exposure mechanism is turned on and the beam position detecting mechanism is moved along the Y axis direction and light amounts of the exposure beams passing through the one slit portion and the other slit portion reach peaks, and
on the basis of the positions of the first connecting pixel and the second connecting pixel which have been specified at the beam position detecting mechanism, the exposure control mechanism corrects image data inputted to the first exposure head and the second exposure head so that images are connected at the first connecting pixel and the second connecting pixel.

26. The image forming device of claim 25, wherein the mechanism for selectively turning the plurality of pixels on and off at the exposure head comprises a spatial light modulator which modulates light from a light source in accordance with inputted image data, and forms an image.

27. The image forming device of claim 26, wherein the spatial light modulator is a DMD which has a large number of extremely small reflecting mirrors which reflect the light from the light source and can be set at either of two positions, and the DMD forms pixels by switching a reflection path of the light from the light source by switching positions of the reflecting mirrors to either of the two positions in accordance with the image data.

28. The image forming device of claim 25, further wherein the exposure control mechanism corrects image data input to the first exposure head and the second exposure head and wherein the exposure control mechanism eliminates Y axis direction offset between images of the first connecting pixel and the second connecting pixel by setting exposure timings of the first exposure head and the second exposure head in accordance with a Y axis direction distance between the first connecting pixel and the second connecting pixel and a scanning speed of the exposure heads.

29. The image forming device of claim 25, wherein the exposure control mechanism corrects image data input to the first exposure head and the second exposure head and wherein the exposure control mechanism eliminates X axis direction offset between images of the first connecting pixel and the second connecting pixel by inputting image data to the first exposure head and the second exposure head so that image data overlap at the first connecting pixel and the second connecting pixel.

30. An image forming device comprising:
an exposure mechanism having a plurality of exposure heads which have a mechanism selectively turning a plurality of pixels on and oft and which form an image by exposing while scanning an image forming surface in a given direction, the pixels of the exposure heads being arranged diagonally with respect to the scanning direction;
a beam position detecting mechanism detecting positions of exposure beams of the respective exposure heads, the beam position detecting mechanism which is provided so as to be movable on a reference surface along a Y axis direction with relation to the exposure heads and has at least one pair of slit portions, which are inclined relative to pixel arrangements of the exposure heads and one of which is disposed along the Y axis direction which is parallel to the scanning direction of the exposure device and another of which is disposed along an X axis direction which is perpendicular to the Y axis direction, and a light amount measuring mechanism which measures light amounts of exposure beams which pass through the slit portions;
a pixel position specifying mechanism specifying positions of pixels of the exposure heads on the basis of positions of exposure beams detected by the beam position detecting mechanism; and
an exposure control mechanism controlling the exposure heads on the basis of the pixel positions specified at the pixel position specifying mechanism,
wherein the pixel position specifying mechanism
specifies a position of a first connecting pixel from a pixel position at a time when pixels in a vicinity of a juncture of an image at a first exposure head are successively turned on and a light amount of an exposure beam passing through the one slit portion at the beam position detecting mechanism reaches a peak, and from a pixel position at a time when a light amount of an exposure beam passing through the other slit portion at the beam position detecting mechanism reaches a peak, and from a difference in Y coordinates of the two pixels, and
specifies a position of a second connecting pixel from a pixel position at a time when pixels of a second exposure head are successively turned on and a light amount of an exposure beam passing through the one slit portion at the beam position detecting mechanism reaches a peak, and from a pixel position at a time when a light amount of an exposure beam passing through the other slit portion at the beam position detecting mechanism reaches a peak, and from a difference in Y coordinates of the two pixels, and on the basis of the positions of the first connecting pixel and the second connecting pixel which have been specified at the pixel position specifying mechanism, the exposure control mechanism corrects image data inputted to the first exposure head and the second exposure head so that images are connected at the first connecting pixel and the second connecting pixel.

31. The image forming device of claim 30, further wherein the exposure control mechanism corrects image data input to the first exposure head and the second exposure head and wherein the exposure control mechanism eliminates Y axis direction offset between images of the first connecting pixel and the second connecting pixel by setting exposure timings of the first exposure head and the second exposure head in accordance with a Y axis direction distance between the first connecting pixel and the second connecting pixel and a scanning speed of the exposure heads.

32. The image forming device of claim 30, wherein the exposure control mechanism corrects image data input to the first exposure head and the second exposure head and wherein the exposure control mechanism eliminates X axis direction offset between images of the first connecting pixel and the second connecting pixel by inputting image data to the first exposure head and the second exposure head so that image data overlap at the first connecting pixel and the second connecting pixel.

33. The image forming device according to claim 30, wherein, when the exposure beam position is measured by the beam position detecting mechanism, the beam position detecting mechanism moves in the Y axis direction and the exposure heads are fixed at a predetermined position, or the beam position detecting mechanism is fixed at a predetermined position and the exposure heads move in the Y axis direction.

34. An image forming device comprising:
an exposure mechanism having a plurality of exposure heads which have a mechanism selectively turning a plurality of pixels on and off, and which form an image by exposing while scanning an image forming surface in a given direction;
a beam position detecting mechanism formed so as to be movable on a reference surface along a Y axis direction and an X axis direction, the beam position detecting device having a first slit portion which is long in the Y axis direction, a second slit portion which is long in the X axis direction, and a light amount measuring mechanism which measures light amounts of exposure beams passing through the first and second slit portions;
a pixel position specifying mechanism specifying positions of pixels of the exposure heads on the basis of positions of exposure beams detected by the beam position detecting mechanism; and
an exposure control mechanism controlling the exposure heads on the basis of the pixel positions specified at the pixel position specifying mechanism, wherein the pixel position specifying mechanism
specifies a position of a first connecting pixel on the basis of a position of the beam position detecting mechanism, at a time when the first connecting pixel in a vicinity of a juncture of an image at a first exposure head at the exposure mechanism is turned on and the beam position detecting mechanism is moved along the X axis direction and the Y axis direction and light amounts of the exposure beams passing through the first slit portion and the second slit portion reach peaks, and specifies a position of a second connecting pixel on the basis of a position of the beam detecting mechanism, at a time when the second connecting pixel in a vicinity of a juncture of an image at a second exposure head of the exposure mechanism is turned on and the beam position detecting mechanism is moved along the X axis direction and the Y axis direction and light amounts of the exposure beams passing through the first slit portion and the second slit portion reach peaks, and on the basis of the positions of the first connecting pixel and the second connecting pixel which have been specified at the beam position detecting mechanism, the exposure control mechanism corrects image data inputted to the first exposure head and the second exposure head so that images are connected at the first connecting pixel and the second connecting pixel.

35. The image forming device of claim 34, further wherein the exposure control mechanism corrects image data input to the first exposure head and the second exposure head and wherein the exposure control mechanism eliminates Y axis direction offset between images of the first connecting pixel and the second connecting pixel by setting exposure timings of the first exposure head and the second exposure head in accordance with a Y axis direction distance between the first connecting pixel and the second connecting pixel and a scanning speed of the exposure heads.

36. The image forming device of claim 34, wherein the exposure control mechanism corrects image data input to the first exposure head and the second exposure head and wherein the exposure control mechanism eliminates X axis direction offset between images of the first connecting pixel and the second connecting pixel by inputting image data to the first exposure head and the second exposure head so that image data overlap at the first connecting pixel and the second connecting pixel.

37. The image forming device of claim 34, wherein the exposure control mechanism corrects first image data input to the first exposure head and second image data input to the second exposure and wherein the first image data and the second image data overlap via the first connecting pixel belong to the first image data and the second connecting pixel belonging to the second image data.

* * * * *